(12) United States Patent
Cho et al.

(10) Patent No.: US 12,431,901 B2
(45) Date of Patent: Sep. 30, 2025

(54) SEMICONDUCTOR DEVICES HAVING PARALLEL-TO-SERIAL CONVERTERS THEREIN

(71) Applicant: SAMSUNG ELECTRONICS CO., LTD., Suwon-si (KR)

(72) Inventors: Hyunyoon Cho, Suwon-si (KR); Eunseok Shin, Suwon-si (KR); Youngdon Choi, Suwon-si (KR); Jaeduk Han, Seoul (KR); Hyuntae Kim, Seoul (KR); Jeonghyu Yang, Seoul (KR); Sanghun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 156 days.

(21) Appl. No.: 18/175,795

(22) Filed: Feb. 28, 2023

(65) Prior Publication Data
US 2023/0403010 A1    Dec. 14, 2023

(30) Foreign Application Priority Data
Jun. 10, 2022   (KR) .................. 10-2022-0070836

(51) Int. Cl.
*H03K 19/096*    (2006.01)
*H03K 5/15*      (2006.01)

(52) U.S. Cl.
CPC ....... *H03K 19/096* (2013.01); *H03K 5/15013* (2013.01)

(58) Field of Classification Search
CPC ............... H03K 19/094; H03K 19/096; H03K 19/0963; H03K 5/133; H03K 5/15;
(Continued)

(56) References Cited

U.S. PATENT DOCUMENTS 5,045,714 A  *  9/1991  Park ................. H04J 3/047
                                               370/537
6,970,116 B2    11/2005  Masaki
(Continued)

FOREIGN PATENT DOCUMENTS

JP          4735395 B2      7/2011

OTHER PUBLICATIONS

Depaoli et al. "A 64 GB/s Low-Power Transceiver for Short-Reach PAM-4 Electrical Links in 28-nm FDSOI CMOS" IEEE Journal of Solid-State Circuits 54(1):6-17 (Jan. 2019).
(Continued)

*Primary Examiner* — Jason M Crawford
(74) *Attorney, Agent, or Firm* — Wolf, Greenfield & Sacks, P.C.

(57) ABSTRACT

A parallel-to-serial converter includes first to fourth input nodes configured to receive first to fourth data input signals, respectively, and an output node configured to output a data output signal. First to fourth logic circuits are provided, which are configured to electrically couple respective ones of the first to fourth input nodes one-at-a-time to the output node, in synchronization with first to fourth clock signals. The first logic circuit includes a first input circuit, a second input circuit, and an output circuit electrically coupled to the first and second input circuits. The output circuit includes a first pull-up transistor and a first pull-down transistor having drain terminals coupled to the output node, a second pull-up transistor connected between a source terminal of the first pull-up transistor and a first power supply node, and a second pull-down transistor connected between a source terminal of the first pull-down transistor and a second power supply node.

12 Claims, 18 Drawing Sheets

(58) Field of Classification Search
CPC .......... H03K 5/15013; H03K 5/15026; H03K 5/1504; H03K 5/1506
See application file for complete search history.

(56) References Cited

U.S. PATENT DOCUMENTS

| | | | | |
|---|---|---|---|---|
| 7,187,721 | B1* | 3/2007 | Dally | ................ H04L 25/0282 375/295 |
| 7,924,963 | B2* | 4/2011 | Dally | .................. H04J 3/0685 375/327 |
| 9,100,029 | B2* | 8/2015 | Lee | ........................ H03M 9/00 |
| 9,432,061 | B2* | 8/2016 | Fiedler | ............... H03K 19/0005 |
| 9,525,573 | B2* | 12/2016 | Fiedler | ............... H04L 25/4904 |
| 9,674,025 | B2* | 6/2017 | Dickson | ................. H04L 27/01 |
| 10,110,334 | B2* | 10/2018 | Gupta | ................. H04L 7/0037 |
| 10,177,901 | B2 | 1/2019 | Jung | |
| 10,193,539 | B1* | 1/2019 | Choi | ...................... H03K 21/10 |
| 10,367,506 | B1* | 7/2019 | Chatwin | .......... H03K 19/09429 |
| 10,680,592 | B2 | 6/2020 | Zhao et al. | |
| 10,931,305 | B2* | 2/2021 | Choi | ...................... H03K 5/135 |
| 11,003,203 | B2* | 5/2021 | Poon | ........................ G06F 1/04 |
| 11,088,681 | B2 | 8/2021 | Arai et al. | |
| 11,349,481 | B1* | 5/2022 | Sivarajah | ......... H03K 19/17744 |
| 2006/0103557 | A1* | 5/2006 | Padaparambil | ......... H03M 9/00 341/101 |
| 2006/0104124 | A1* | 5/2006 | Padaparambil | ......... G11C 7/106 365/189.05 |
| 2008/0164928 | A1 | 7/2008 | Rausch | |
| 2013/0002300 | A1* | 1/2013 | Fiedler | ................. H03K 19/096 326/97 |
| 2013/0007500 | A1* | 1/2013 | Fiedler | ..................... G06F 1/10 713/501 |
| 2015/0123826 | A1* | 5/2015 | Lee | ......................... H03M 9/00 341/101 |
| 2018/0241542 | A1* | 8/2018 | Jung | ....................... G11C 7/106 |
| 2019/0013928 | A1* | 1/2019 | Lee | ......................... H04L 7/0041 |
| 2020/0195274 | A1* | 6/2020 | Kim | .......................... H03M 7/04 |
| 2020/0293080 | A1* | 9/2020 | Poon | ..................... H03K 5/1565 |
| 2022/0131544 | A1* | 4/2022 | Kang | ................. H03K 19/0963 |
| 2022/0382317 | A1* | 12/2022 | Park | ..................... G06F 1/06 |
| 2022/0385287 | A1* | 12/2022 | Park | ..................... H03K 17/693 |
| 2023/0208418 | A1* | 6/2023 | Han | ......................... H03K 5/13 |
| 2023/0208423 | A1* | 6/2023 | Katta | ............... H03K 19/01855 326/83 |
| 2023/0368824 | A1* | 11/2023 | Lee | ..................... G11C 11/4076 |
| 2023/0403010 | A1* | 12/2023 | Cho | ..................... H03K 19/096 |
| 2024/0203466 | A1* | 6/2024 | Park | ..................... G11C 7/1063 |

OTHER PUBLICATIONS

Hafez et al. "A 32-48 GB/s Serializing Transmitter Using Multiphase Serialization in 65 nm CMOS Technology" IEEE Journal of Solid-State Circuits 50(3):38-40 (Mar. 2015).

Sun et al. "A 10 GB/s low-power 4:1 multiplexer in 0.18 μm CMOS" 2010 International Symposium on Signals, Systems and Electronics (Sep. 2010).

* cited by examiner

SEMICONDUCTOR DEVICES HAVING PARALLEL-TO-SERIAL CONVERTERS THEREIN

REFERENCE TO RELATED APPLICATION

This application claims the benefit under 35 USC 119(a) to Korean Patent Application No. 10-2022-0070836, filed Jun. 10, 2022, the disclosure of which is hereby incorporated herein by reference.

BACKGROUND

The present inventive concept relates to semiconductor devices that operate by exchanging signals, such as data signals, with other external semiconductor devices at high rate. Data processed in parallel inside a semiconductor device may be serialized by a serializer (e.g., parallel-to-serial converter), which is connected to an interface of the semiconductor device, and may be transmitted externally. To increase a data transmission rate, the serializer may operate in synchronization with a high frequency clock signal. Thus, there is a need to implement a serializer that may accurately generate a data output signal by serializing multiple pieces of data while operating at high speed.

SUMMARY

Example embodiments provide a semiconductor device in which jitter characteristics of a data output signal and the like may be enhanced by improving performance of a serializer, which serializes data received from a plurality of latches.

According to some example embodiments, a semiconductor device includes first to fourth input nodes for receiving first to fourth data input signals, and an output node for outputting a data output signal. First to fourth logic circuits are provided, which are connected between the first to fourth input nodes and the output nodes. These logic circuits are configured to connect each of the first to fourth input nodes to the output node, in-sync with first to fourth clock signals (having unequal phases). Each of the first to fourth logic circuits includes a first input circuit, a second input circuit, and an output circuit. The output circuit includes a first pull-up transistor and a first pull-down transistor connected to the output node, a second pull-up transistor connected between the first pull-up transistor and a first power supply node, and a second pull-down transistor connected between the first pull-down transistor and a second power supply node. In some embodiments, an output node of the first input circuit is connected to a gate of the first pull-up transistor, and an output node of the second input circuit is connected to a gate of the first pull-down transistor.

According to additional embodiments, a semiconductor device includes a first logic circuit, which is connected between a first input node receiving a first data input signal and an output node. The first logic circuit is configured to output the first data input signal to the output node at a rising edge of a first clock signal having a phase difference of 90 degrees from the first data input signal. A second logic circuit is provided, which is connected between a second input node receiving a second data input signal and the output node. The second logic circuit is configured to output the second data input signal to the output node at a rising edge of a second clock signal having a phase difference of 90 degrees from the second data input signal. A third logic circuit is provided, which is connected between a third input node receiving a third data input signal and the output node. The third logic circuit is configured to output the third data input signal to the output node at a rising edge of a third clock signal, which is a complementary signal of the first clock signal. A fourth logic circuit is provided, which is connected between a fourth input node receiving a fourth data input signal and the output node. The fourth logic circuit is configured to output the fourth data input signal to the output node at a rising edge of a fourth clock signal, which is a complementary signal of the second clock signal.

According to further embodiments, a semiconductor device is provided, which includes a clock buffer configured to output a plurality of clock signals having different phases, and a selection circuit. The selection circuit includes a plurality of logic circuits that are configured to select one of a plurality of data input signals, and output a selected data input signal as a data output signal. Each of the plurality of logic circuits is configured to receive the plurality of clock signals and one of the plurality of data input signals. Each of the plurality of logic circuits outputs one of the plurality of data input signals as the data output signal at a point in time at which a value of a pair of clock signals among the plurality of clock signals changes.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
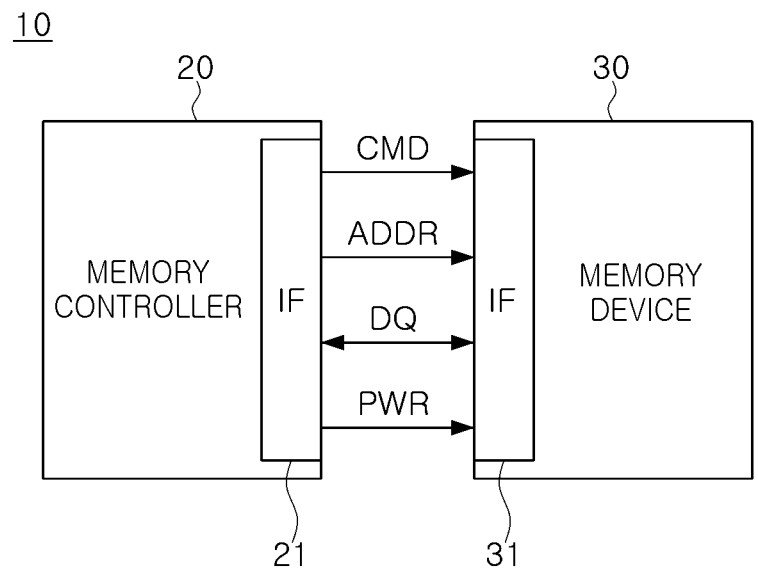
FIG. 1 is a diagram schematically illustrating a system including semiconductor devices according to an example embodiment.

FIG. 1 is a diagram schematically illustrating a system including semiconductor devices according to an example embodiment. Referring to FIG. 1, a system 10 according to an example embodiment includes a plurality of semiconductor devices that may be configured as a memory controller 20 and a memory device 30. The memory controller 20 and the memory device 30 may include interfaces 21 and 31, respectively. An interface 21 of the memory controller 20 may output a command signal CMD, an address signal ADDR, a power supply PWR, and the like to the interface 31 of the memory device 30. The memory device 30 may operate by receiving power PWR, and may execute a program operation for writing data and a read operation for reading the stored data and the like, based on the command signal CMD and the address signal ADDR.

The memory controller 20 and the memory device 30 may exchange data signals DQ with each other through the interfaces 21 and 31. The data signal DQ transmitted from the memory controller 20 to the memory device 30 includes data to be stored in the memory device 30, and the data signal DQ received by the memory controller 20 from the memory device 30 may include at least a portion of data stored in the memory device 30.

To improve the performance of the system 10, it may be necessary to improve the data transmission rate, which is the speed at which the memory controller 20 and the memory device 30 exchange the data signal DQ, as well as the operating speed of each of the memory controller 20 and the memory device 30. To increase the data transmission rate, the memory device 30 may include a serializer, such as a parallel-to-serial converter, which is configured to generate a data signal DQ by serializing data processed in parallel therein. The serializer receives a data input signal corresponding to data processed in parallel within the memory device 30 and serializes the received data input signal, thereby outputting the serial data signal (DQ).

In some embodiments, a circuit for processing data inside the memory device 30 may operate in synchronization with a clock signal of a first frequency, and accordingly, the frequency of each of the data input signals may be the first frequency. On the other hand, the frequency of the data signal DQ may be faster than the first frequency. For example, the frequency of the data signal DQ may be a second frequency that is N times the first frequency (where N is a natural number equal to or greater than 2). The serializer inside the memory device 30 serializes data input signals having a first frequency to output the data signal DQ of the second frequency.

However, in the process of serializing the data input signals of the first frequency to the data signal DQ of the second frequency that is N times the first frequency, influence of noise components such as jitter may increase, or data may not be accurately reflected in the data signal DQ. For example, the serializer included in the memory device 30 may sequentially select and output data input signals at respective rising edges of a plurality of selection signals having a duty ratio of 25%, thereby generating the data signal DQ. At this time, the frequency of each of the plurality of selection signals may be the first frequency, and therefore, a separate pulse generator for generating a plurality of selection signals using the clock signal of the first frequency may be required.

In the above method, since the plurality of selection signals have a lower duty ratio compared to the clock signal, the rising edges of the plurality of clock signals may not be accurately aligned with the data input signals. Accordingly, at least some of the data input signals may not be accurately reflected in the serial data signal DQ. In addition, since the transmission gates included in the serializer are turned on/off with a plurality of selection signals to generate the data signal DQ, the slew rate of the data signal DQ may be reduced because of the transfer gates, and signal integrity may be degraded.

In an example embodiment of the present inventive concept, a serializer serializing data input signals without a transmission gate to generate a data signal DQ is proposed. Accordingly, the slew rate of the data signal DQ may be increased, and deterioration of signal integrity may be significantly reduced. In addition, since the data signal DQ is generated by serializing data input signals using a plurality of clock signals without generating a plurality of selection signals, the data input signals may be accurately reflected in the data signal DQ. In addition, since the pulse generator for generating a plurality of selection signals may be omitted, the design difficulty and complexity of the serializer may be reduced.

Figure 2:
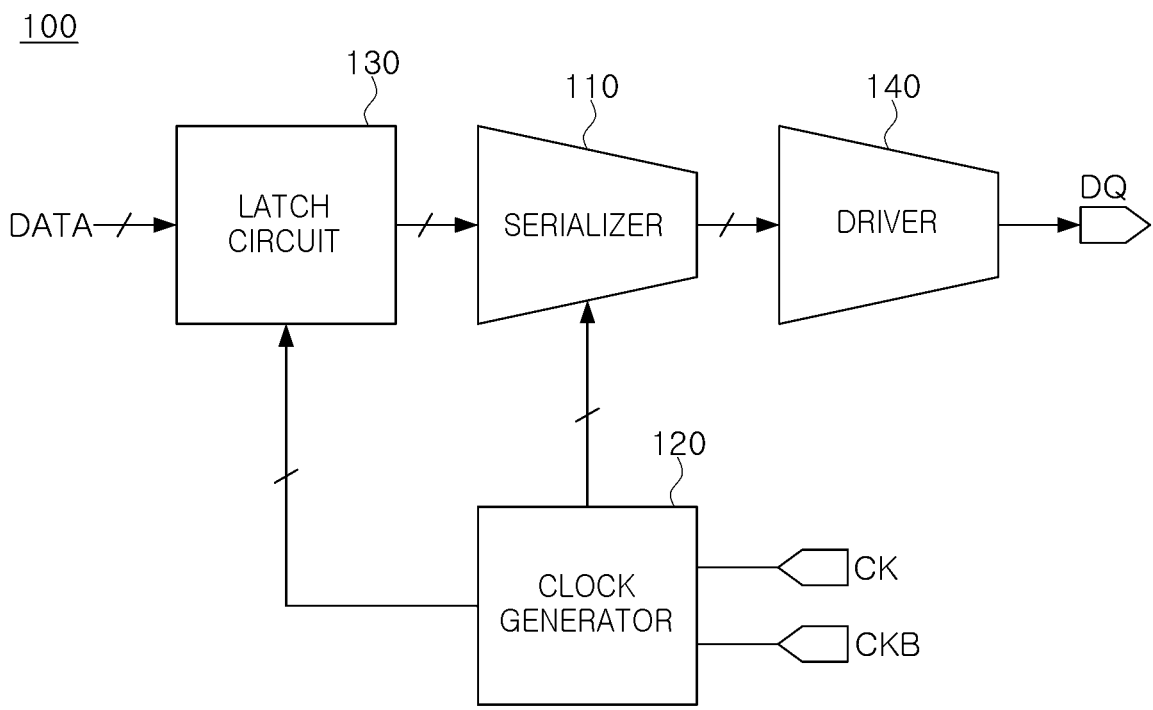
FIG. 2 is a schematic block diagram illustrating a semiconductor device according to an example embodiment.

FIG. 2 is a schematic block diagram of a semiconductor device according to an example embodiment. Referring to FIG. 2, a semiconductor device 100 according to an example embodiment may include a serializer 110, a clock generator 120, a latch circuit 130, a driver 140, and the like. The driver 140 outputs the data signal DQ, and the data signal DQ may have a frequency higher than a frequency of each of the data input signals output to the serializer 110 by processing the data DATA by the latch circuit 130.

For example, the latch circuit 130 may receive data DATA and generate data input signals of a first frequency. The first frequency of the data input signals may be a frequency of each of the clock signals output by the latch circuit 130 and the clock generator 120. The clock generator 120 receives the clock signals CK and CKB having a phase difference of 180 degrees. A plurality of clock signals may be output to the serializer 110 and the latch circuit 130. The clock generator 120 may output a plurality of clock signals to the serializer 110 and the latch circuit 130 in common.

The serializer 110 may generate a data output signal by serializing the data input signals received from the latch circuit 130. The data output signal may have the same frequency as the data signal DQ. The serializer 110 may function as a multiplexer that selects and outputs one of the data input signals in response to the clock signals output from the clock generator 120. For example, the serializer 110 may generate a data output signal by sequentially selecting and outputting data input signals in response to clock signals.

Clock signals input to the serializer 110 may have a duty ratio of 50% and may have different phases. For example, when the serializer 110 receives the first to fourth data input signals from the latch circuit 130 and receives the first to fourth clock signals from the clock generator 120, the serializer may select the first data input signal at the rising edge of the first clock signal and output the selected signal as a data output signal. Similarly, the serializer may select each of the second to fourth data input signals at the rising edge of each of the second to fourth clock signals, respectively, and output the selected data as a data output signal.

The first to fourth clock signals may have a phase difference of 90 degrees. For example, the second clock signal has a phase difference of −90 degrees (i.e., delayed by T/4, where T is a period of the clock signal) from the first clock signal, the third clock signal has a phase difference of −90 degrees from the second clock signal, and the fourth clock signal may have a phase difference of −90 degrees from the third clock signal. Accordingly, the third clock signal may have a phase difference of −180 degrees from the first clock signal, and the fourth clock signal may have a phase difference of −270 degrees from the first clock signal.

The first to fourth data input signals may also have a predetermined phase difference from each other. For example, the latch circuit 130 may adjust the phases such that the first to fourth data input signals have a phase difference of 90 degrees, and may transmit the adjusted signal to the serializer 110. Accordingly, in the serializer 110, each of the first to fourth data input signals may have a predetermined phase difference from each of the first to fourth clock signals.

For example, in the serializer 110, the first data input signal and the first clock signal may have a phase difference of 90 degrees. Accordingly, the first data input signal may be accurately reflected in the data output signal at the rising edge of the first clock signal. Similarly, each of the second to fourth data input signals may have a phase difference of 90 degrees from each of the second to fourth clock signals. By designing the phases of the data input signals and the clock signals in this manner, data input signals may be accurately reflected in the data output signal output by the serializer 110.

Figure 3:
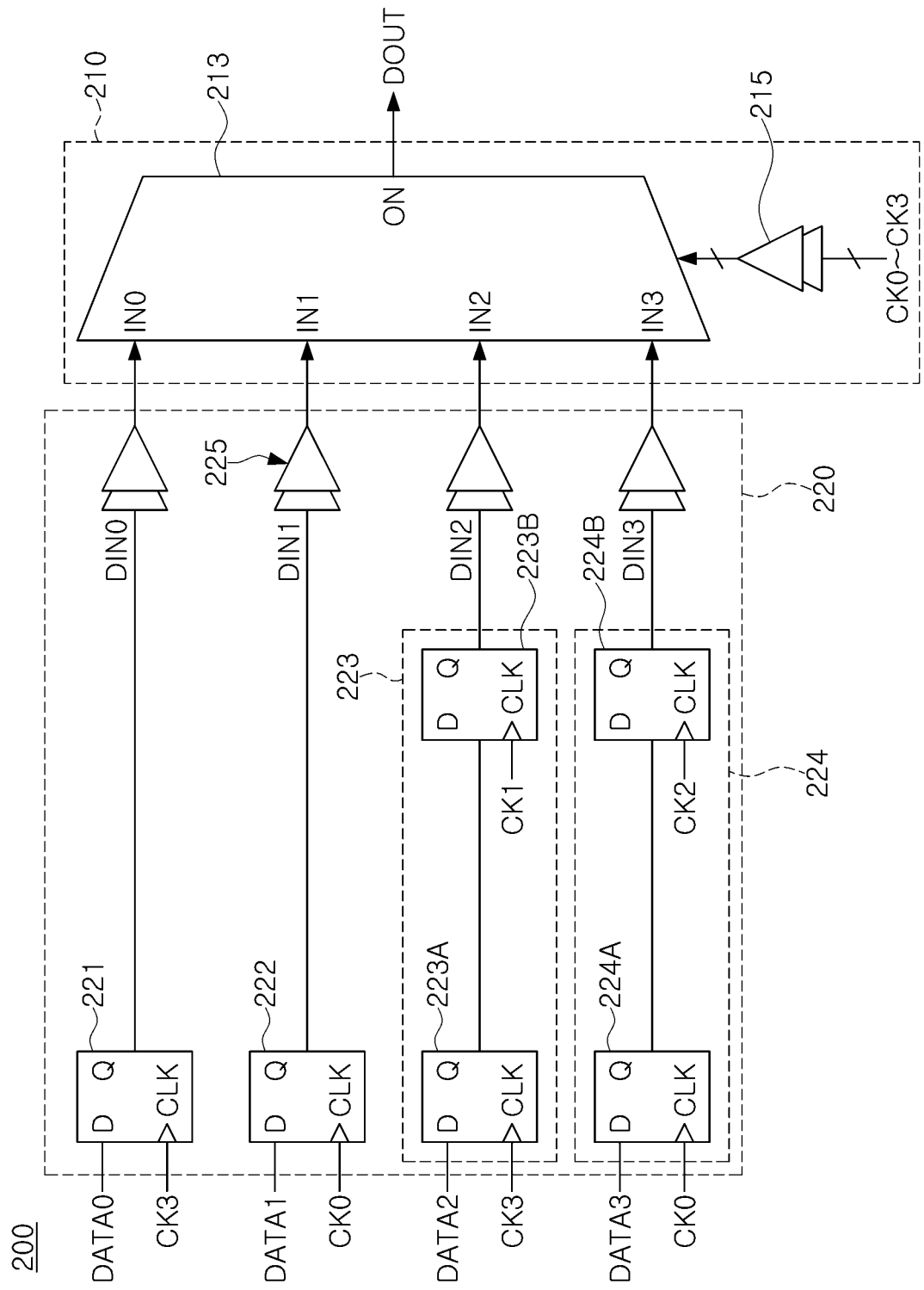
FIG. 3 is a schematic block diagram illustrating a semiconductor device according to an example embodiment.

FIG. 3 is a block diagram schematically illustrating a semiconductor device according to an example embodiment. Referring to FIG. 3, a semiconductor device 200 according to an example embodiment may include a serializer 210, a latch circuit 220, and the like. For example, the data output signal DOUT output by the serializer 210 may be a data signal output by the semiconductor device 200 to another external semiconductor device. By serializing the plurality of data signals DATA0-DATA3 by the serializer 210 to generate a data output signal DOUT, a data transmission rate at which data is transmitted between the semiconductor device 200 and another semiconductor device may be improved.

For example, the serializer 210 may include a selection circuit 213 having a plurality of input nodes IN0-IN3 and one output node ON. The data input signals DIN0-DIN3 are input to the plurality of input nodes IN0-IN3 through the buffer circuit 225, and the data output signal DOUT may be output through the output node ON. On the other hand, the serializer 210 further includes a clock buffer 215, and the clock buffer 215 may receive the plurality of clock signals CK0-CK3 from the clock generator and transmit the received signals to the selection circuit 213.

The selection circuit 213 may operate as a multiplexer that selects one of the plurality of input nodes IN0-IN3 and connects the selected node to the output node ON. For example, the selection circuit may transfer the first data input signal DIN0 input to the first input node IN0 to the output node ON at the rising edge of the first clock signal CK0, and transfer the second data input signal DIN1 to the output node ON at the rising edge of the second clock signal CK1. On the other hand, the selection circuit may transfer the third data input signal DIN2 to the output node ON at the rising edge of the third clock signal CK2, and transfer the fourth data input signal DIN3 to the output node ON at the rising edge of the fourth clock signal CK3. Accordingly, data included in the first to fourth data input signals DIN0-DIN3 may be sequentially serialized and included in the data output signal DOUT.

The latch circuit 220 may include first to fourth latch circuits 221 to 224. The first to fourth latch circuits 221-224 may generate first to fourth data input signals DIN0-DIN3 by latching the first to fourth data signals DATA0-DATA3. As illustrated in FIG. 3, the first latch circuit 221 may generate a first data input signal DIN0 by latching the first data signal DATA0 at the rising edge of the fourth clock signal CK3, and the second latch circuit 222 may generate the second data input signal DIN1 by latching the second data signal DATA1 at the rising edge of the first clock signal CK0.

Each of the third latch circuit 223 and the fourth latch circuit 224 may include first sub-latches 223A and 224A and second sub-latches 223B and 224B. Referring to the third latch circuit 223, the first sub-latch 223A latches and outputs the third data signal DATA2 at the rising edge of the fourth clock signal CK3, and the second sub-latch 223B may generate the third data input signal DIN2 by latching the output of the first sub-latch 223A at the rising edge of the second clock signal CK1. The first sub-latch 224A and the second sub-latch 224B in the fourth latch circuit 224 may operate in response to the first clock signal CK0 and the third clock signal CK2, respectively.

By configuring the latch circuit 220 as illustrated in FIG. 3, the first to fourth data input signals DIN0-DIN3 may have a predetermined phase difference. For example, the first to fourth clock signals CK0-CK3 may have a phase difference of 90 degrees from each other. Accordingly, compared with the first data input signal DIN0, the second data input signal DIN1 may have a phase that is 90 degrees slower (i.e., delayed), the third data input signal DIN2 has a phase that is 180 degrees slower, and the fourth data input signal DIN3 may have a phase that is 270 degrees slower.

In one embodiment, after the first data input signal DIN0 is input to the first input node IN0 and a predetermined waiting time elapses, the first data input signal DIN0 may be reflected to the data output signal DOUT. This is because, compared to the point in time at which the first data input signal DIN0 is input to the first input node DIN0 is determined according to the rising edge of the fourth clock signal CK3, the point in time at which the first data input signal DIN0 is reflected to the data output signal DOUT may be determined according to a rising edge of the first clock signal CK0. The rising edge of the first clock signal CK0 may appear after a time corresponding to ¼ of one period of the first clock signal CK0 has elapsed from the rising edge of the fourth clock signal CK3. Accordingly, after a waiting time corresponding to a phase difference of 90 degrees has elapsed from the point in time when the first data input signal DIN0 is input to the first input node DIN0, the first data input signal DIN0 may be reflected in the data output signal DOUT.

The second to fourth data input signals DIN1 to DIN3 may also be reflected in the data output signal DOUT after the waiting time has elapsed from the respective points in time input to the second to fourth input nodes IN1-IN3 in the above manner. Accordingly, each of the first to fourth data input signals DIN0-DIN3 may be accurately reflected in the data output signal DOUT.

Figure 4:
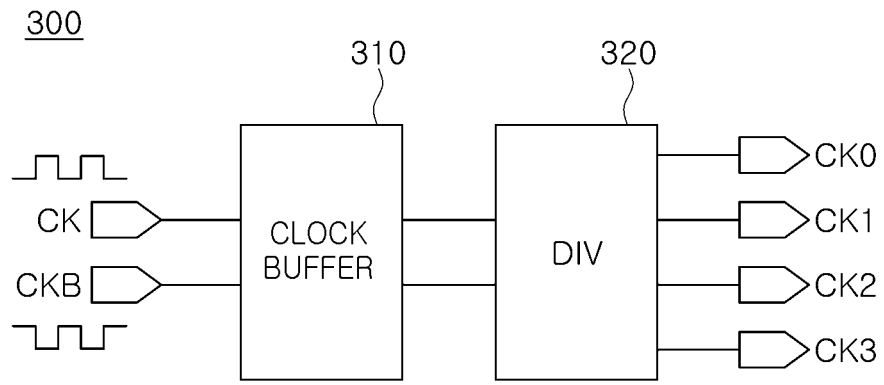
FIG. 4 is a schematic block diagram of a semiconductor device according to an example embodiment.

FIG. 4 is a block diagram schematically illustrating a clock generator 300 included in a semiconductor device according to an example embodiment. Referring to FIG. 4, a clock generator 300 may include a clock buffer 310 and a clock divider 320. The clock buffer 310 may receive the reference clock signals CK and CKB, which have a phase difference of 180 degrees relative to each other, and transmit the received clock signals to the clock divider 320. In some embodiments, the clock divider 320 may be configured to include a plurality of latches connected in series, and may output first to fourth clock signals CK0-CK3 having different phases. Nonetheless, the frequencies of the first to fourth clock signals CK0-CK3 may be the same as the frequencies of the reference clock signals CK and CKB. As described above, the first to fourth clock signals CK0-CK3 may have a predetermined phase difference from each other. With respect to the first clock signal CK0, the second clock signal CK1 has a phase difference of 90 degrees, the third clock signal CK2 has a phase difference of 180 degrees, and the fourth clock signal CK3 may have a phase difference of 270 degrees.

The first to fourth clock signals CK0-CK3 may be input to the serializer 210 and the latch circuit 220 described above with reference to FIG. 3. Referring to FIG. 3, the serializer 210 may select the respective first to fourth data input signals DIN0-DIN3 for respective rising edges of the first to fourth clock signals CK0-CK3 and output the selected data to the output node ON. Accordingly, the first to fourth data input signals DIN0-DIN3 may be sequentially included in the data output signal DOUT.

As described above, the first to fourth clock signals CK0-CK3 may have a phase difference of 90 degrees. Accordingly, with respect to the data output signal DOUT, one of the first to fourth data input signals DIN0 to DIN3 may be transmitted at times corresponding to ¼ of one period of each of the first to fourth clock signals CK0 to CK3. In detail, one period of the data output signal DOUT may be ¼ of one period of each of the first to fourth clock signals CK0-CK3. Since the first to fourth data input signals DIN0-DIN3 have the same period as the first to fourth clock signals CK0-CK3, the frequency of the data output signal DOUT may be four times the frequency of each of the first to fourth data input signals DIN0-DIN3.

Figure 5:
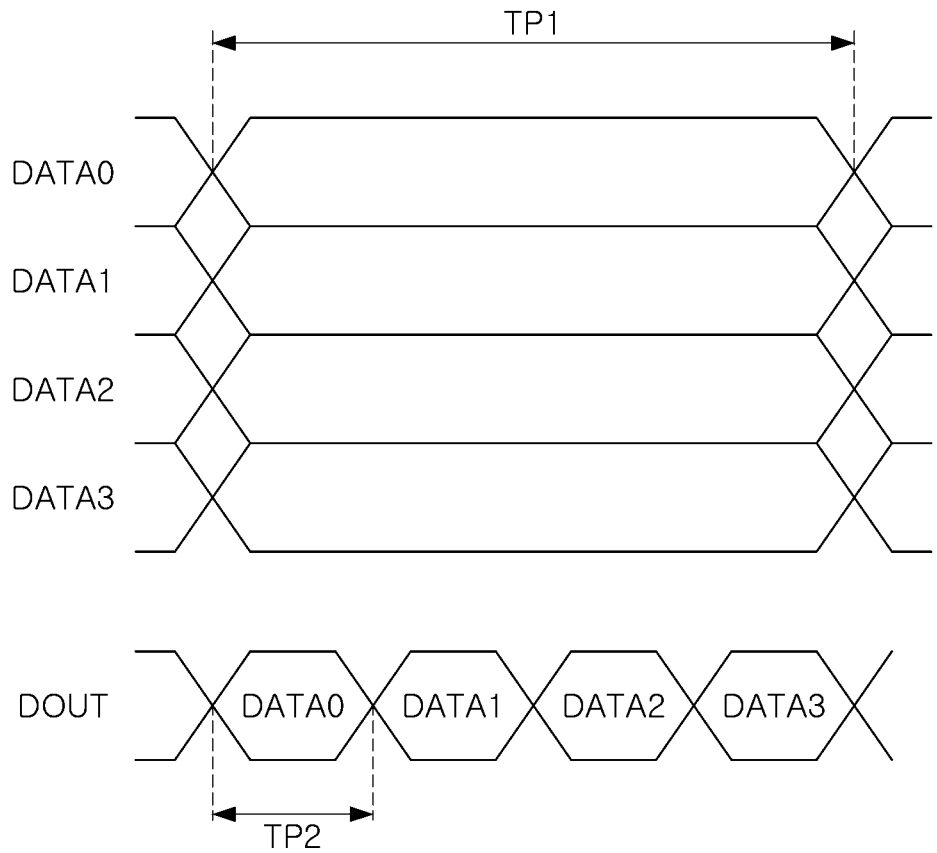
FIG. 5 is a diagram schematically illustrating signals processed by a semiconductor device according to an example embodiment.

FIG. 5 is a timing diagram schematically illustrating signals processed by a semiconductor device according to an example embodiment. Referring to FIG. 5, a semiconductor device according to an example embodiment generates a data output signal DOUT by serializing data signals DATA0-DATA3 that may be processed in parallel, and may output the data output signal DOUT to another external semiconductor device. The data signals DATA0-DATA3 may be serialized as a data output signal DOUT in a serializer; the serializer may receive data input signals obtained by adjusting the phases of the data signals DATA0-DATA3. As illustrated in FIG. 5, each of the data signals DATA0-DATA3 may be a signal having a first period TP1. On the other hand, the data output signal DOUT is a signal having a second period TP2 shorter than the first period TP1; the first period TP1 may be N times the second period TP2. In this case, N may be the number of data signals DATA0-DATA3 serialized into one data output signal DOUT. In the example embodiment illustrated in FIG. 5, the first period TP1 is four times the second period TP2, and the data output signal DOUT may be a signal that is 4 times faster (i.e., has a high frequency by a factor of 4) than each of the data signals DATA0-DATA3. As shown by FIG. 5, the semiconductor device may output the data output signal DOUT at a speed higher than a speed at which the data signals DATA0-DATA3 are internally processed. Accordingly, the speed at which the semiconductor device exchanges data with other external semiconductor devices may be improved.

Figure 6:
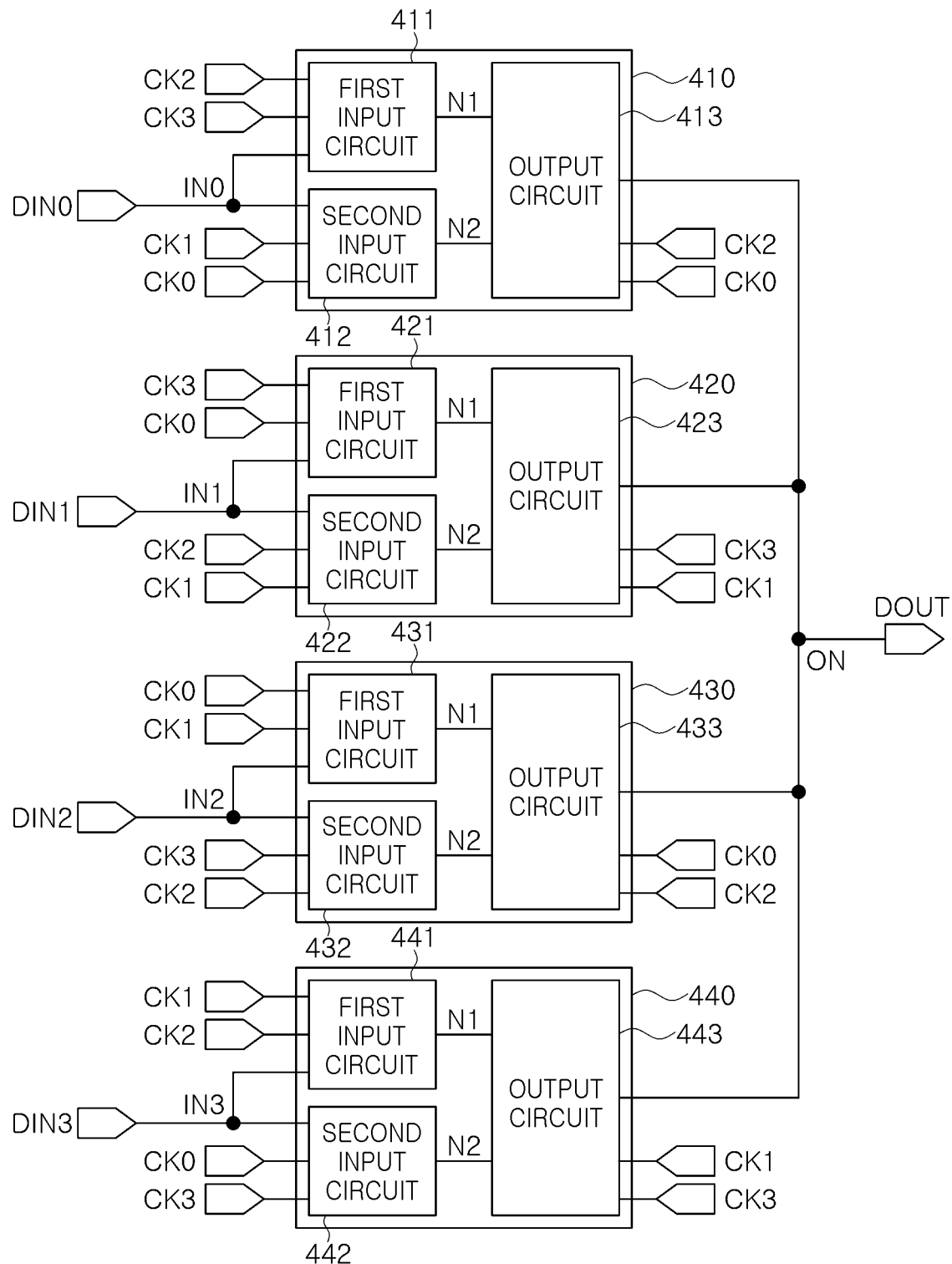
FIG. 6 is a schematic block diagram illustrating a serializer included in a semiconductor device according to an example embodiment.

FIG. 6 is a schematic block diagram illustrating a serializer included in a semiconductor device, according to an example embodiment. Referring to FIG. 6, a serializer 400 according to an example embodiment may include first to fourth logic circuits 410-440. And, the first to fourth logic circuits 410 and 440 may include: first input circuits 411, 421, 431 and 441, second input circuits 412, 422, 432, 442, output circuits 413, 423, 433 and 443, respectively. The first logic circuit 410 is connected between the first input node IN0 and the output node ON, and the second logic circuit 420 may be connected between the second input node IN1 and the output node ON. The third logic circuit 430 is connected between the third input node IN2 and the output node ON, and the fourth logic circuit 440 may be connected between the fourth input node IN3 and the output node ON.

The first to fourth logic circuits 410-440 may respectively receive the first to fourth clock signals CK0-CK3 to operate. As an example, each of the first to fourth logic circuits 410-440 includes a plurality of elements, and a portion of the plurality of elements may be turned on and turned off by the first to fourth clock signals CK0-CK3. However, in the respective first to fourth logic circuits 410-440, correspondence relationships between the plurality of elements and the first to fourth clock signals CK0-CK3 may be different from each other. For example, referring to FIG. 6, the elements included in the output circuit 413 of the first logic circuit 410 are turned on and turned off by the first clock signal CK0 and the third clock signal CK2, while the elements included in the output circuit 423 of the second logic circuit 420 may be turned on and off by the second clock signal CK1 and the fourth clock signal CK3.

Each of the first to fourth logic circuits 410-440 may receive one of the first to fourth data input signals DIN0-DIN3. As shown, the first logic circuit 410 receives the first data input signal DIN0 through the first input node IN1, and the first data input signal DIN0 may be commonly input to the first input circuit 411 and the second input circuit 412.

When the first to fourth data input signals DIN0-DIN3 are input, in each of the first to fourth logic circuits 410-440, the voltage of the first node N1 or the second node N2 may be set by data of the first to fourth data input signals DIN0-DIN3. For example, each of the first to fourth data input signals DIN0-DIN3 transfers first data or second data at every cycle, and for example, the first data may correspond to '1' and the second data may correspond to '0.' When the first data input signal DIN0 transmits first data in a specific period, in the corresponding period, the voltage level of the first data input signal DIN0 may be a first voltage level higher than a predetermined reference level. On the other hand, when the first data input signal DIN0 transmits the second data in a specific period, in the corresponding period, the voltage level of the first data input signal DIN0 may be a second voltage level lower than the reference level.

In the first logic circuit 410, the voltage of each of the first node N1 and the second node N2 may vary according to data transmitted as the first data input signal DIN0 in a corresponding period. For example, when the first data input signal DIN0 transmits the first data, the voltage of the first node may be set to the second voltage level, and when the first data input signal DIN1 transmits second data, the voltage of the second node may be set to the first voltage level. Detailed operations of the first to fourth logic circuits 410 to 440 will be described hereinbelow.

The serializer 400 may output a data output signal DOUT from the output node ON. The data output signal DOUT may be generated through a serialization process of sequentially arranging data included in the first to fourth data input signals DIN0-DIN3. Hereinafter, the operation of the serializer 400 will be described in more detail with reference to FIG. 6.

Figure 7:
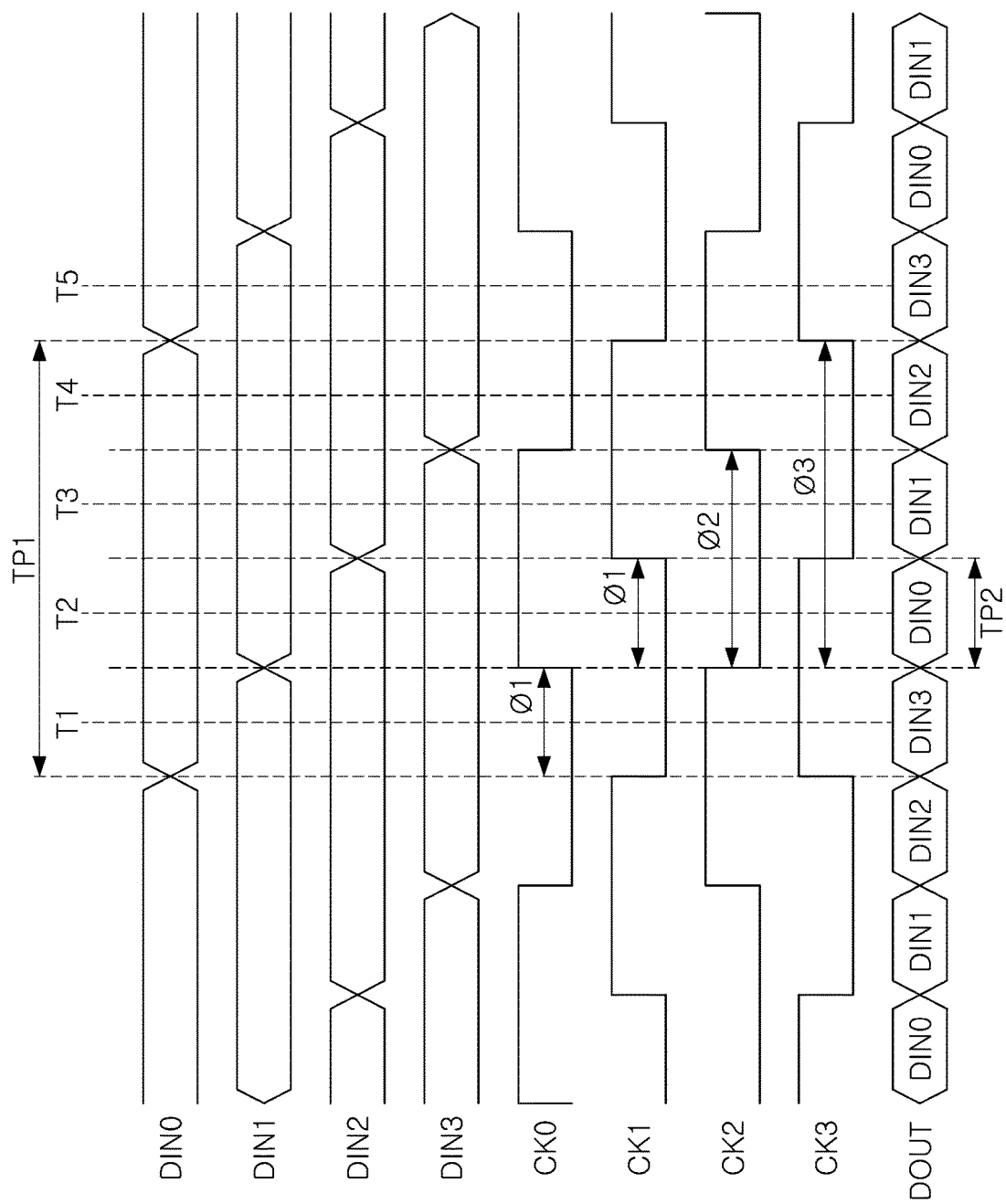
FIG. 7 is a diagram illustrating an operation of a semiconductor device according to an example embodiment.

FIG. 7 is a timing diagram illustrating an operation of a semiconductor device according to an example embodiment. FIG. 7 may be a drawing illustrating first to fourth data input signals DIN0-DIN3, first to fourth clock signals CK0-CK3 and the data output signal DOUT input to the serializer 400 according to the example embodiment illustrated in FIG. 6. First, referring to FIG. 7, each of the first to fourth data input signals DIN0-DIN3 and the first to fourth clock signals CK0-CK3 may be a signal having a first period TP1. As described above with reference to FIG. 3, the first to fourth data input signals DIN0-DIN3 may be time-controlled to have a predetermined phase difference and then input to the serializer 400. For example, the first data input signal DIN0 and the second data input signal DIN1 may have a first phase difference φ1. Accordingly, the first data input signal DIN0 is input to the first logic circuit 410, and after a delay time corresponding to the first phase difference φ1 has elapsed, the second data input signal DIN1 may be input to the second logic circuit 420. The first phase difference φ1 may be 90 degrees, and thus the delay time corresponding to the first phase difference φ1 may be ¼ of the first period TP1.

Also, as illustrated in FIG. 7, the first to fourth clock signals CK0-CK3 may also have a predetermined phase difference from each other. For example, the first clock signal CK0 and the second clock signal CK1 have a first phase difference φ1, the first clock signal CK0 and the third clock signal CK2 have a second phase difference φ2, and the first clock signal CK0 and the fourth clock signal CK3 may have a third phase difference φ3. As described above, the first phase difference φ1 is 90 degrees, the second phase difference φ2 may be 180 degrees, and the third phase difference φ3 may be 270 degrees.

The serializer 400 may select one of the first to fourth clock signals CK0-CK3 at the rising edge of each of the first to fourth clock signals CK0-CK3 and may output the selected signal to the output node ON. Accordingly, the data output signal DOUT may be changed at respective rising edges of the first to fourth clock signals CK0-CK3. Referring to FIG. 7, the first data input signal DIN0 is output as the data output signal DOUT at the rising edge of the first clock signal CK0, and at the rising edge of the second clock signal CK1, the second data input signal DIN1 may be output as the data output signal DOUT. On the other hand, at the rising edge of the third clock signal CK2, the third data input signal DIN2 is output as the data output signal DOUT, and at the rising edge of the fourth clock signal CK3, the fourth data input signal DIN3 may be output as the data output signal DOUT.

As a result, one period of the data output signal DOUT may be defined as a time between the rising edge of the first clock signal CK0 and the rising edge of the second clock signal CK1. Therefore, as illustrated in FIG. 7, the second period TP2 of the data output signal DOUT may be equal to the time corresponding to the first phase difference φ1, and may be ¼ of the first period TP1. In detail, the frequency of the data output signal DOUT may be four times the frequency of each of the first to fourth data input signals DIN0-DIN3 and the first to fourth clock signals CK0-CK3. Accordingly, the data transmission rate of the data signal output by the semiconductor device may increase by the operation of the serializer 400.

In an example embodiment, as illustrated in FIG. 7, the first to fourth data input signals DIN0-DIN3 are rearranged in the time domain to have a predetermined phase difference from each other, and a point in time at which one period starts in the respective first to fourth data input signals DIN0-DIN3 may arrive earlier than the rising edges of the first to fourth clock signals CK0-CK3 by a time corresponding to the first phase difference φ1. Accordingly, the respective first to fourth data input signals DIN0 to DIN3 at the respective rising edges of the first to fourth clock signals CK0 to CK3 may be accurately reflected in the data output signal DOUT, and high-speed operation may be stably implemented.

In addition, as illustrated in FIG. 7, in an example embodiment of the present inventive concept, since the serializer 400 operates in synchronization with the first to fourth clock signals CK0-CK3 having a 50% duty ratio, a circuit such as a pulse generator for generating clock signals having a duty ratio other than 50% may be omitted. Accordingly, the design difficulty and the degree of integration of the semiconductor device may be improved.

Figure 8:
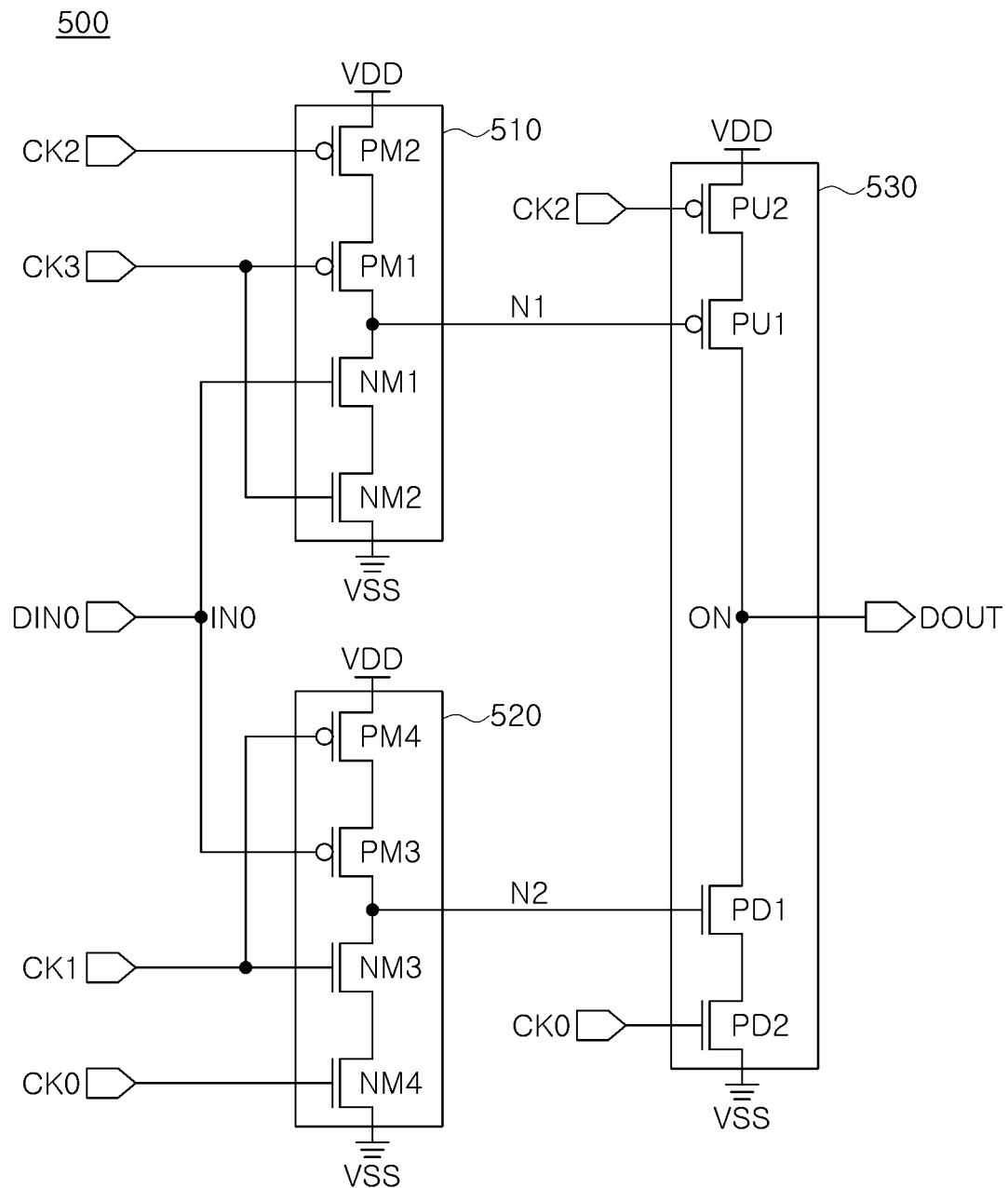
FIG. 8 is a schematic circuit diagram illustrating a logic circuit included in a serializer in a semiconductor device according to an example embodiment.
Figure 9:
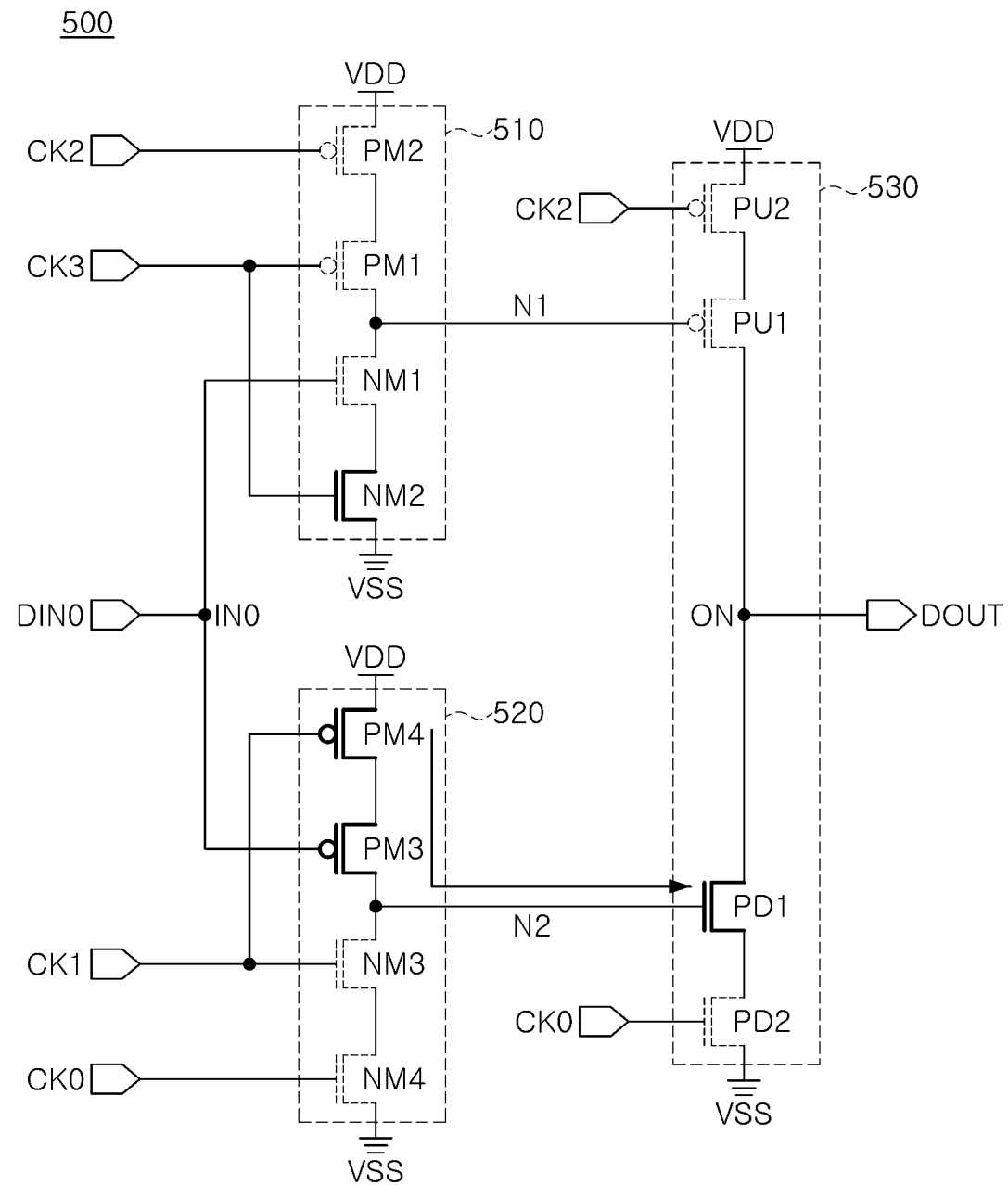
FIGS. 9-10 are diagrams illustrating the operation of the logic circuit illustrated in FIG. 8.
Figure 10:
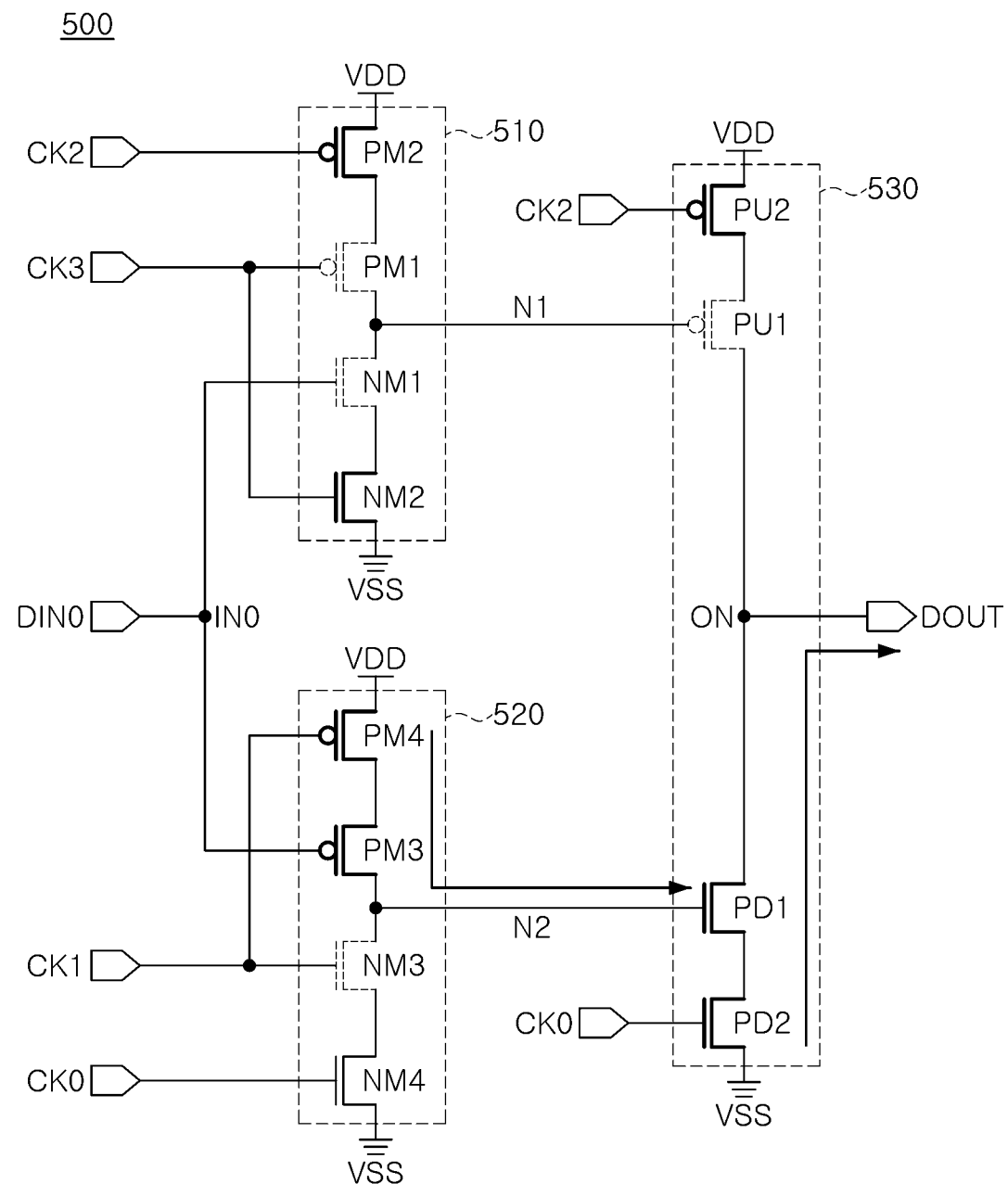

FIG. 8 is a schematic circuit diagram illustrating a logic circuit included in a serializer in a semiconductor device according to an example embodiment; and FIGS. 9 and 10 are diagrams that have been highlighted to illustrate the operation of the logic circuit illustrated in FIG. 8. In particular, FIG. 8 may be a circuit diagram schematically illustrating a first logic circuit 500 connected between a first input node IN0 and an output node ON among logic circuits included in the serializer according to an example embodiment. Referring to FIG. 8, the first logic circuit 500 may receive a first data input signal DIN0 through a first input node IN0, and may include a first input circuit 510, a second input circuit 520, and an output circuit 530.

The output circuit 530 may include a first pull-up transistor PU1, a second pull-up transistor PU2, a first pull-down transistor PD1, a second pull-down transistor PD2, and the like. The first pull-up transistor PU1 and the first pull-down transistor PD1 may be connected to the output node ON, the second pull-up transistor PU2 may be connected between the first pull-up transistor PU1 and the first power node, and the second pull-down transistor PD2 may be connected between the first pull-down transistor PD1 and the second power node. A first power voltage VDD is supplied to the first power node, and a second power voltage VSS of a level lower than the first power voltage VDD may be supplied to the second power node. For example, the first power voltage VDD may be defined as a first voltage level, and the second power voltage VSS may be defined as a second voltage level.

The first pull-up transistor PU1 and the second pull-up transistor PU2 may be implemented as PMOS transistors, and the first pull-down transistor PD1 and the second pull-down transistor PD2 may be implemented as NMOS transistors. The first pull-up transistor PU1 may be turned on and off by the voltage of the first node N1 that is the output node of the first input circuit 510, and the second pull-up transistor PU2 may be turned on and off by the third clock signal CK2. On the other hand, the first pull-down transistor PD1 is turned on and off by the voltage of the second node N2 that is the output node of the second input circuit 520, and the second pull-down transistor PD2 may be turned on and off by the first clock signal CK0.

Each of the first input circuit 510 and the second input circuit 520 includes a plurality of transistors, and for example, the number of transistors included in the first input circuit 510 and the number of transistors included in the second input circuit 520 may be the same. Referring to the first input circuit 510, a first node N1 is defined between a drain terminal of the first PMOS transistor PM1 and a drain terminal of the first NMOS transistor NM1, the second PMOS transistor PM2 may have a source terminal connected to the first power node (VDD), and the second NMOS transistor NM2 may have a source terminal connected to the second power node (VSS). In the second input circuit 520, a second node N2 is defined between a drain of the third PMOS transistor PM3 and a drain of the third NMOS transistor NM3, the fourth PMOS transistor PM4 has a source terminal connected to the first power node, and the fourth NMOS transistor NM4 has a source terminal connected to the second power node.

The first data input signal DIN0 may be input to each gate of the first NMOS transistor NM1 of the first input circuit 510 and the third PMOS transistor PM3 of the second input circuit 520. In the first input circuit 510, the second PMOS transistor PM2 may be turned on and off by the third clock signal CK2, and the first PMOS transistor PM1 and the second NMOS transistor NM2 may be turned on and off by the fourth clock signal CK3. On the other hand, in the second input circuit 520, the fourth NMOS transistor NM4 is turned on and off by the first clock signal CK0, and the fourth PMOS transistor PM4 and the third NMOS transistor NM3 may be turned on and off by the second clock signal CK1.

Hereinafter, an operation in which the first data input signal DIN0 is output as the data output signal DOUT will be described with reference to FIGS. 9 and 10. FIG. 9 is a circuit diagram illustrating the state of the first logic circuit 500 at a first point in time T1 according to the example embodiment illustrated in FIG. 7, and FIG. 10 may be a circuit diagram illustrating a state of the first logic circuit 500 at a second point in time T2. First, referring to FIG. 7, values of the first to fourth clock signals CK0-CK3 at the respective first point in time T1 and second point in time T2 may be as illustrated in Table 1 below. In Table 1 below, '1' may correspond to a high voltage level that each of the first to fourth clock signals CK0-CK3 may have, and '0' may correspond to a low voltage level that each of the first to fourth clock signals CK0-CK3 may have.

TABLE 1

| Point in time | CK0 | CK1 | CK2 | CK3 |
|---|---|---|---|---|
| T1 | 0 | 0 | 1 | 1 |
| T2 | 1 | 0 | 0 | 1 |

Referring to FIG. 9, at the first point in time T1, the first PMOS transistor PM1, the second PMOS transistor PM2, the third NMOS transistor NM3, and the fourth NMOS transistor NM4 included in the first input circuit 510 and the second input circuit 520 may be turned off. Also, the second pull-up transistor PU2 and the second pull-down transistor PD2 included in the output circuit 530 may be turned off. On the other hand, the second NMOS transistor NM2 may be turned on by the fourth clock signal CK3, and the fourth PMOS transistor PM4 may be turned on by the second clock signal CK1.

On the other hand, in the example embodiment illustrated in FIG. 9, the first data input signal DIN0 is set as the second data at the first point in time T1, and as described above, the second data may correspond to '0.' Accordingly, the first NMOS transistor NM1 is turned off, while the third PMOS transistor PM3 may be turned on. As illustrated in FIG. 9, since the third PMOS transistor PM3 and the fourth PMOS transistor PM4 are turned on in the second input circuit 520, the second node N2 may be set to the first voltage level by the first power node. Accordingly, the first pull-down transistor PD1 of the output circuit 530 may be turned on.

Referring to Table 1 and FIG. 10, values of the first clock signal CK0 and the third clock signal CK2 may change at the second point in time T2 compared to the first point in time T1. Accordingly, as illustrated in FIG. 10, the second PMOS transistor PM2, the fourth NMOS transistor NM4, the second pull-up transistor PU2, and the second pull-down transistor PD2 may be turned on. The output node ON receives the second power voltage VSS through the first pull-down transistor PD1 and the second pull-down transistor PD2, and the data output signal DOUT may be set to the second voltage level such that the same data '0' such as the first data input signal DIN0 may be output.

As described with reference to FIGS. 8 to 10, the logic circuit included in the serializer according to an example embodiment may output the first data input signal DIN0 as the data output signal DOUT, but without a separate transmission gate. In addition, the voltage of the first node N1 or the second node N2 may be set to a voltage level corresponding to the first data input signal DIN0 prior to a point in time at which the rising edge of the first clock signal CK0 arrives. For example, as described with reference to FIG. 9, when the first data input signal DIN0 has a second voltage level corresponding to the second data, the voltage of the second node N2 may be set to a first voltage level higher than the second voltage level. When the rising edge of the first clock signal CK0 arrives after the voltage of the second node N2 is set to the first voltage level, the second pull-down transistor PD2 is turned on such that the output node ON is connected to the second power node, and the voltage level of the data output signal DOUT may be set to the second voltage level. On the other hand, when the first data input signal DIN0 has a first voltage level corresponding to the first data, the voltage of the first node N1 may be set to the second voltage level before the rising edge of the first clock signal CK0 arrives. Also, the operation of each of the second to fourth logic circuits included in the serializer together with the first logic circuit 500 may be similar to the operation of the first logic circuit 500.

Figure 11:
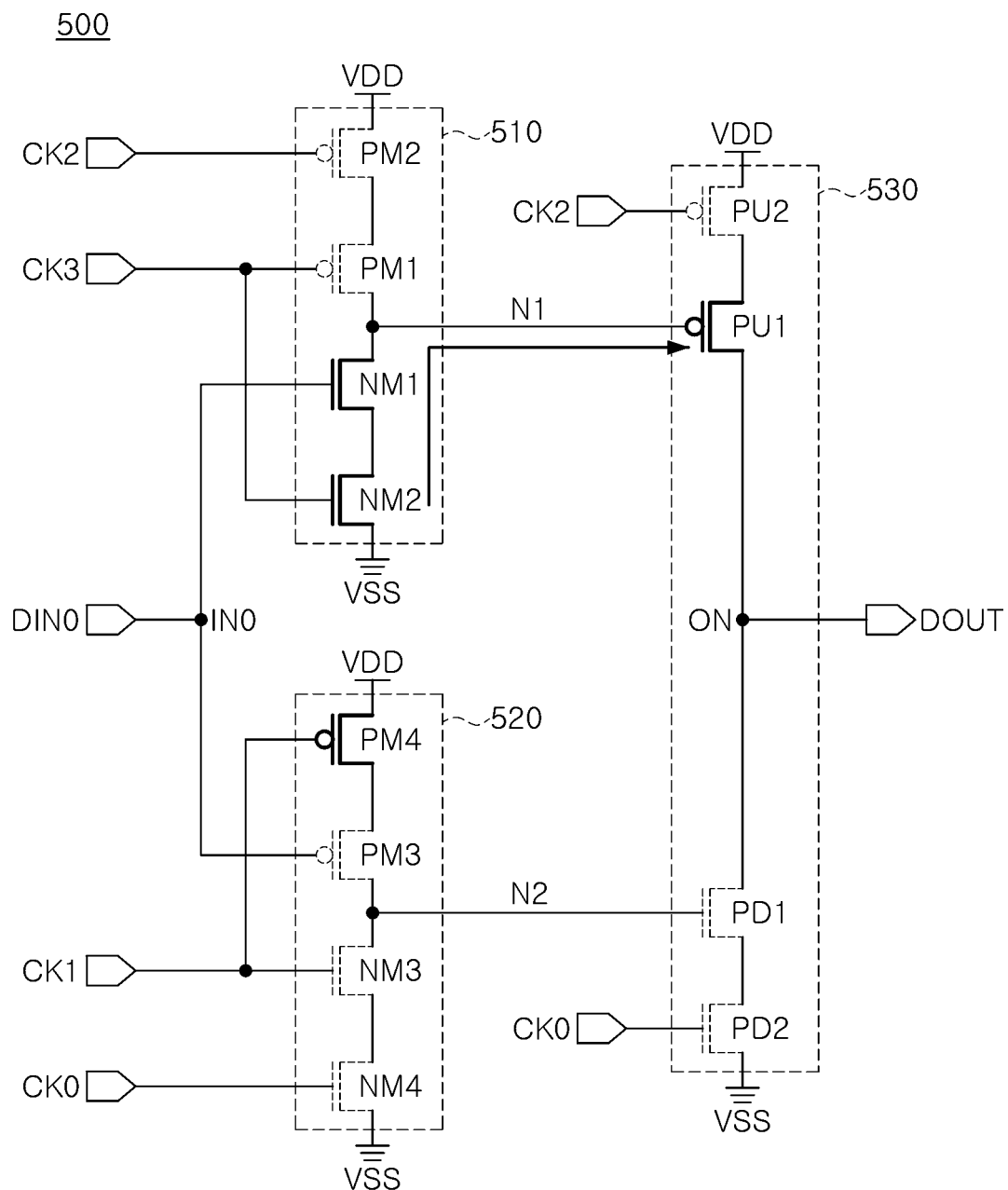
FIGS. 11-19 are diagrams illustrating the operation of a serializer according to an example embodiment.
Figure 12:
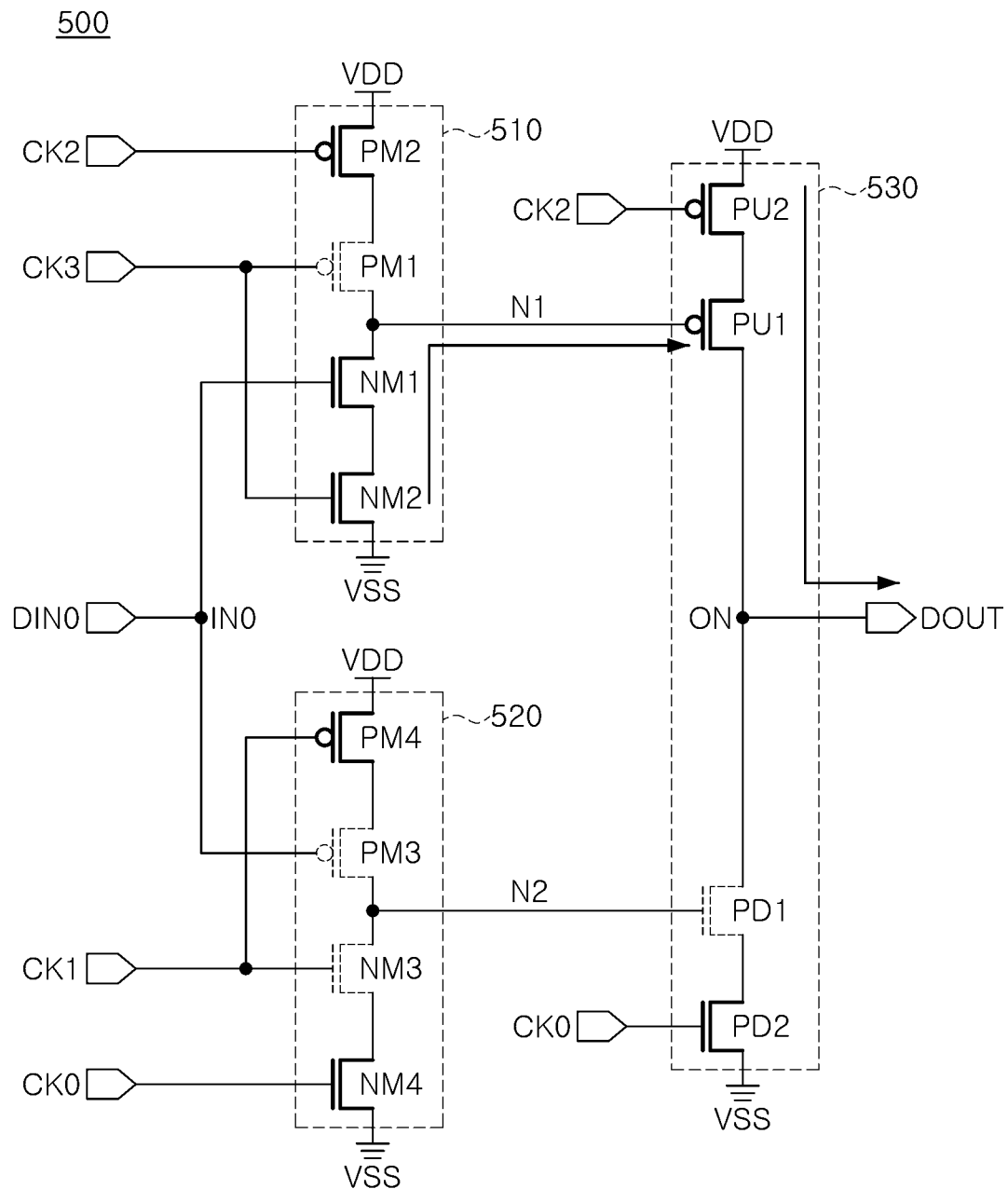

Hereinafter, the operation of the serializer will be described in more detail with reference to FIGS. 11 to 19. FIGS. 11 to 19 are diagrams illustrating the operation of a serializer according to an example embodiment. In particular, FIGS. 11 to 13 may be diagrams schematically illustrating an operation of the first logic circuit 500 when first data is transmitted as the first data input signal DIN0. As described above, the first data may correspond to '1.' Hereinafter, the operation of the first logic circuit 500 will be described with reference to FIG. 7, FIG. 11 illustrates the state of the first logic circuit 500 at a first point in time T1, and FIG. 12 illustrates the state of the first logic circuit 500 at a second point in time T2. On the other hand, FIG. 13 may illustrate the state of the first logic circuit 500 at a third point in time T3. At the respective first point in time T1, second point in time T2 and third point in time T3, the values of the respective first to fourth clock signals CK0-CK3 may be as illustrated in Table 2 below.

TABLE 2

| Point in time | CK0 | CK1 | CK2 | CK3 |
|---|---|---|---|---|
| T1 | 0 | 0 | 1 | 1 |
| T2 | 1 | 0 | 0 | 1 |
| T3 | 1 | 1 | 0 | 0 |

Referring first to FIG. 11, at the first point in time T1, the first PMOS transistor PM1, the second PMOS transistor PM2, the third NMOS transistor NM3 and the fourth NMOS transistor NM4 included in the first input circuit 510 and the second input circuit 520 may be turned off. The second pull-up transistor PU2 and the second pull-down transistor PD2 included in the output circuit 530 may also be turned off. On the other hand, the second NMOS transistor NM2 is turned on by the fourth clock signal CK3, and the fourth PMOS transistor PM4 may be turned on by the second clock signal CK1.

However, unlike the example embodiment illustrated in FIG. 9, in the example embodiment illustrated in FIG. 11, the first NMOS transistor NM1 is turned on by the first data input signal DIN0, and the third PMOS transistor PM3 may be turned off. As illustrated in FIG. 11, since the first NMOS transistor NM1 and the second NMOS transistor NM2 are turned on in the first input circuit 510, the second power node and the first node N1 are connected, and the voltage of the first node N1 may be set to the second voltage level. Accordingly, the first pull-up transistor PU1 of the output circuit 530 may be turned on.

At the second point in time T2, the values of the first clock signal CK0 and the third clock signal CK2 change, and as illustrated in FIG. 12, the second PMOS transistor PM2, the fourth NMOS transistor NM4, the second pull-up transistor PU2, and the second pull-down transistor PD2 may be turned on. The output node ON is connected to the first power node through the first pull-up transistor PU1 and the second pull-up transistor PU2, and the data output signal DOUT may be set to the first voltage level. Accordingly, the data '1' such as the first data input signal DIN0 may be output as the data output signal DOUT.

Figure 13:
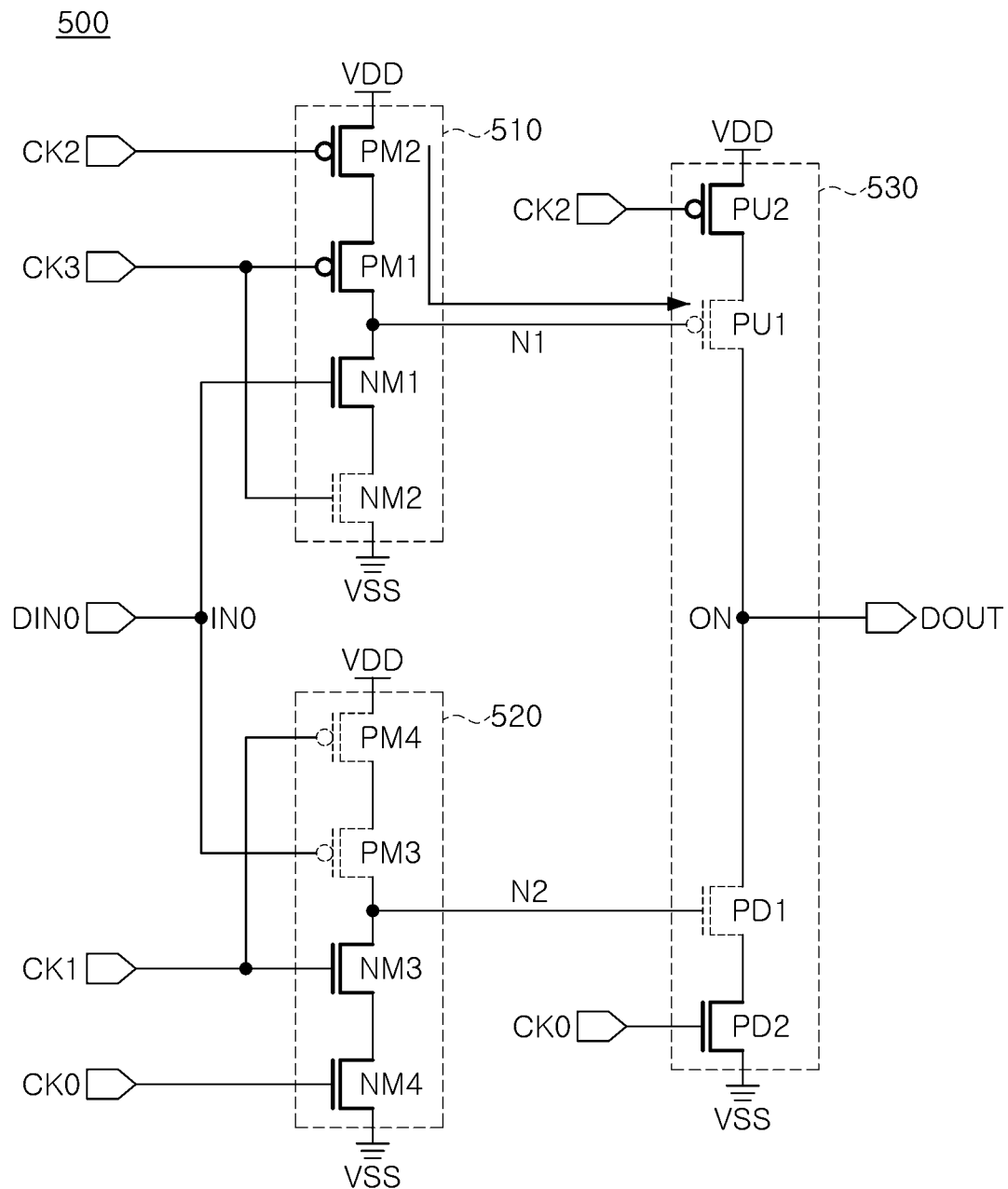

At the third point in time T3, the values of the second clock signal CK1 and the fourth clock signal CK3 are changed compared with the second point in time T2, and as illustrated in FIG. 13, the first PMOS transistor PM1 and the fourth PMOS transistor PM4 are turned on, and the second NMOS transistor NM2 and the third NMOS transistor NM3 may be turned off. Accordingly, the first node N1 is connected to the first power node and set to the first voltage level, and the first pull-up transistor PU1 may be turned off. On the other hand, the second node N2 is connected to the second power node and set to the second voltage level, and the first pull-down transistor PD1 may be turned off. Therefore, as illustrated in FIG. 13, the first input node IN0 is separated from the output node ON, and the output of the first data input signal DIN0 may be stopped.

Figure 14:
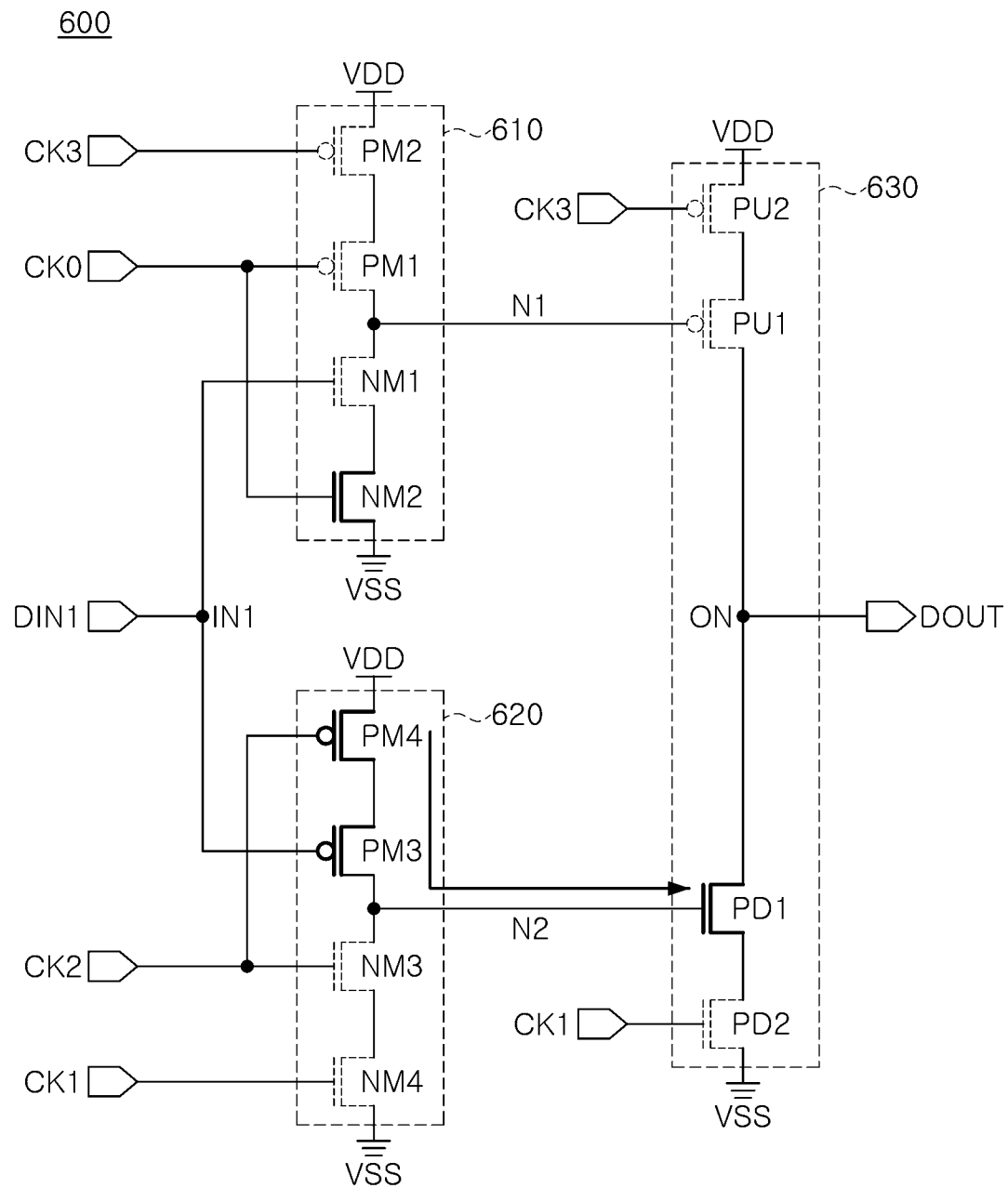
Figure 15:
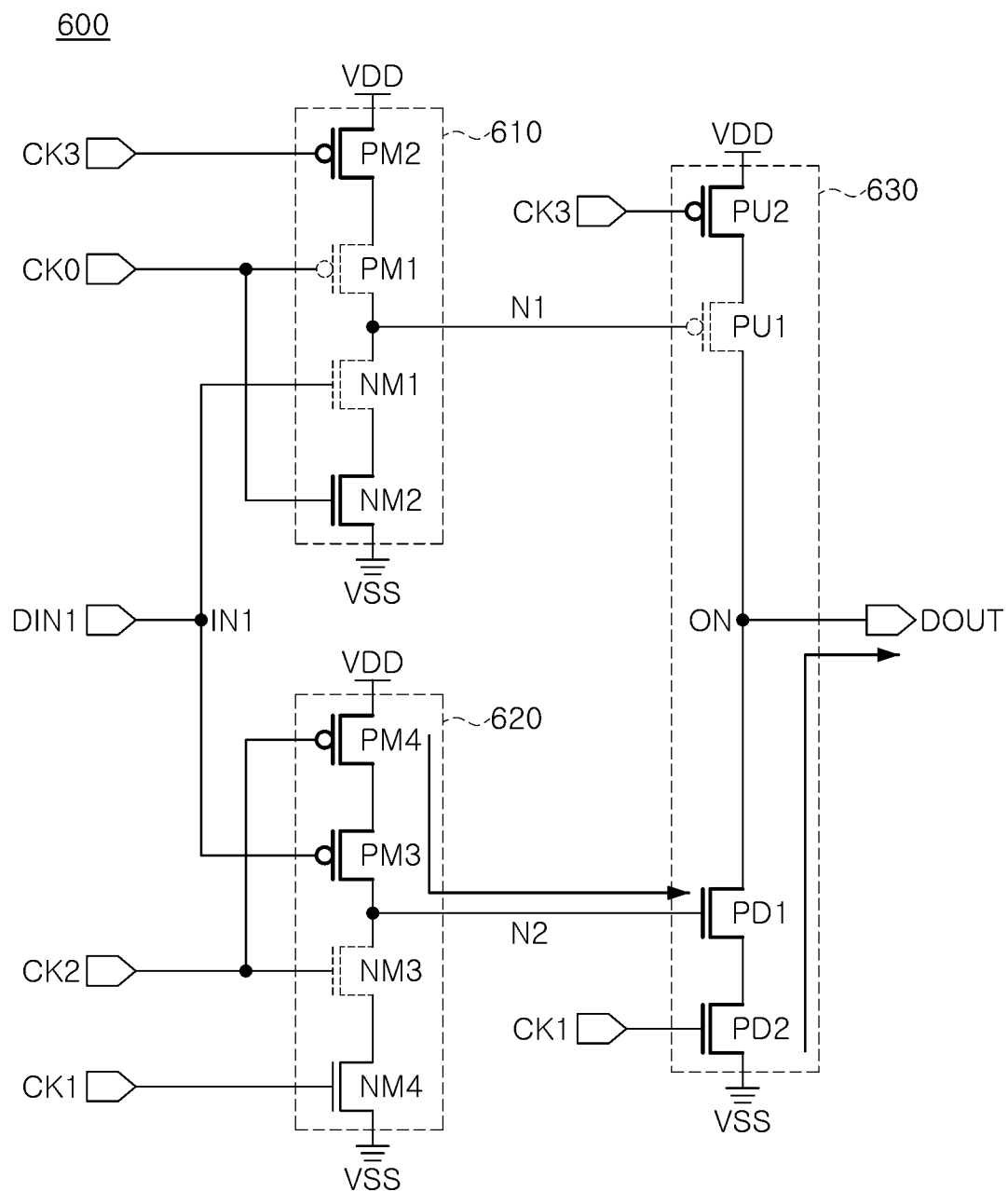

FIGS. 14 and 15 may be diagrams illustrating the operation of a second logic circuit 600 included in the serializer and connected between the second input node IN1 and the output node ON, and may be diagrams schematically illustrating the operation of the second logic circuit 600, such as for when the second data is transmitted as the second data input signal DIN1. As described above, the second data may correspond to '0.' Hereinafter, the operation of the second logic circuit 600 will be described with reference to FIG. 7, and FIG. 14 illustrates the state of the second logic circuit 600 at the second point in time T2, and FIG. 15 may illustrate a state of the second logic circuit 600 at the third point in time T3. Values of the first to fourth clock signals CK0-CK3 at the respective second point in time T2 and third point in time T3 may be as described in Table 2 above.

Referring first to FIG. 14, at the second point in time T2, the first PMOS transistor PM1, the second PMOS transistor PM2, and the third NMOS transistor NM3 and the fourth NMOS transistor NM4 included in a first input circuit 610 and a second input circuit 620 may be turned off. Also, the second pull-up transistor PU2 and the second pull-down transistor PD2 included in the output circuit 530 may be turned off. On the other hand, the second NMOS transistor NM2 is turned on by the first clock signal CK0, and the fourth PMOS transistor PM4 may be turned on by the third clock signal CK2.

In addition, because the second data input signal DIN1 transmits the second data, the first NMOS transistor NM1 may be turned off, and the third PMOS transistor PM3 may be turned on. Therefore, as illustrated in FIG. 14, the second node N2 is connected to the first power node, and the voltage of the second node N2 is set to the first voltage level, such that the first pull-down transistor PD1 of the output circuit 630 may be turned on.

In addition, at the third point in time T3, the values of the second clock signal CK1 and the fourth clock signal CK3 change. And, as illustrated in FIG. 15, the second PMOS transistor PM2, the fourth NMOS transistor NM4, the second pull-up transistor PU2, and the second pull-down transistor PD2 may be turned on. The output node ON is connected to the second power node through the first pull-down transistor PD1 and the second pull-down transistor PD2, and the data output signal DOUT may be set to the second voltage level. Accordingly, data '0' such as the second data input signal DIN1 may be output as the data output signal DOUT.

Figure 16:
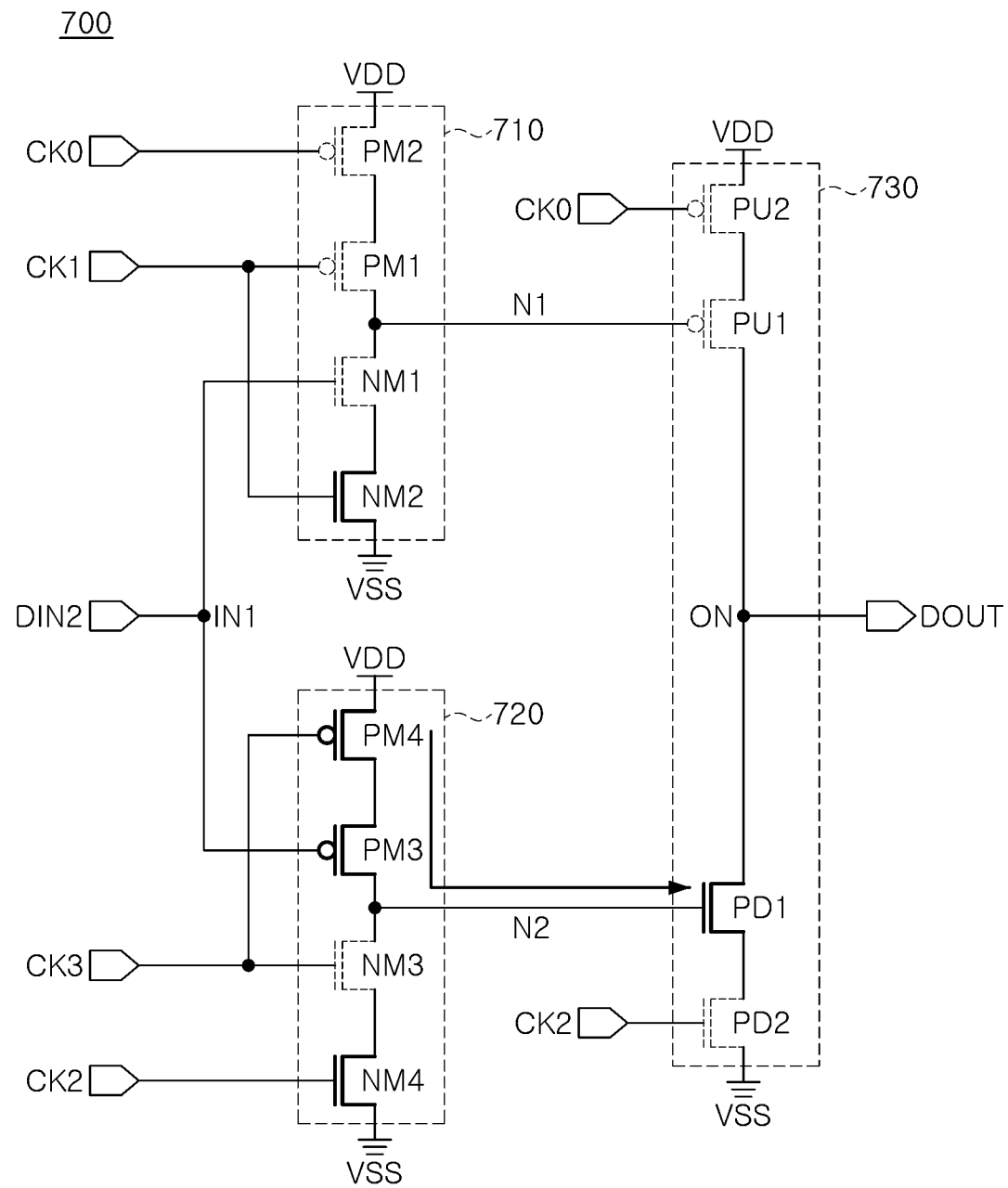
Figure 17:
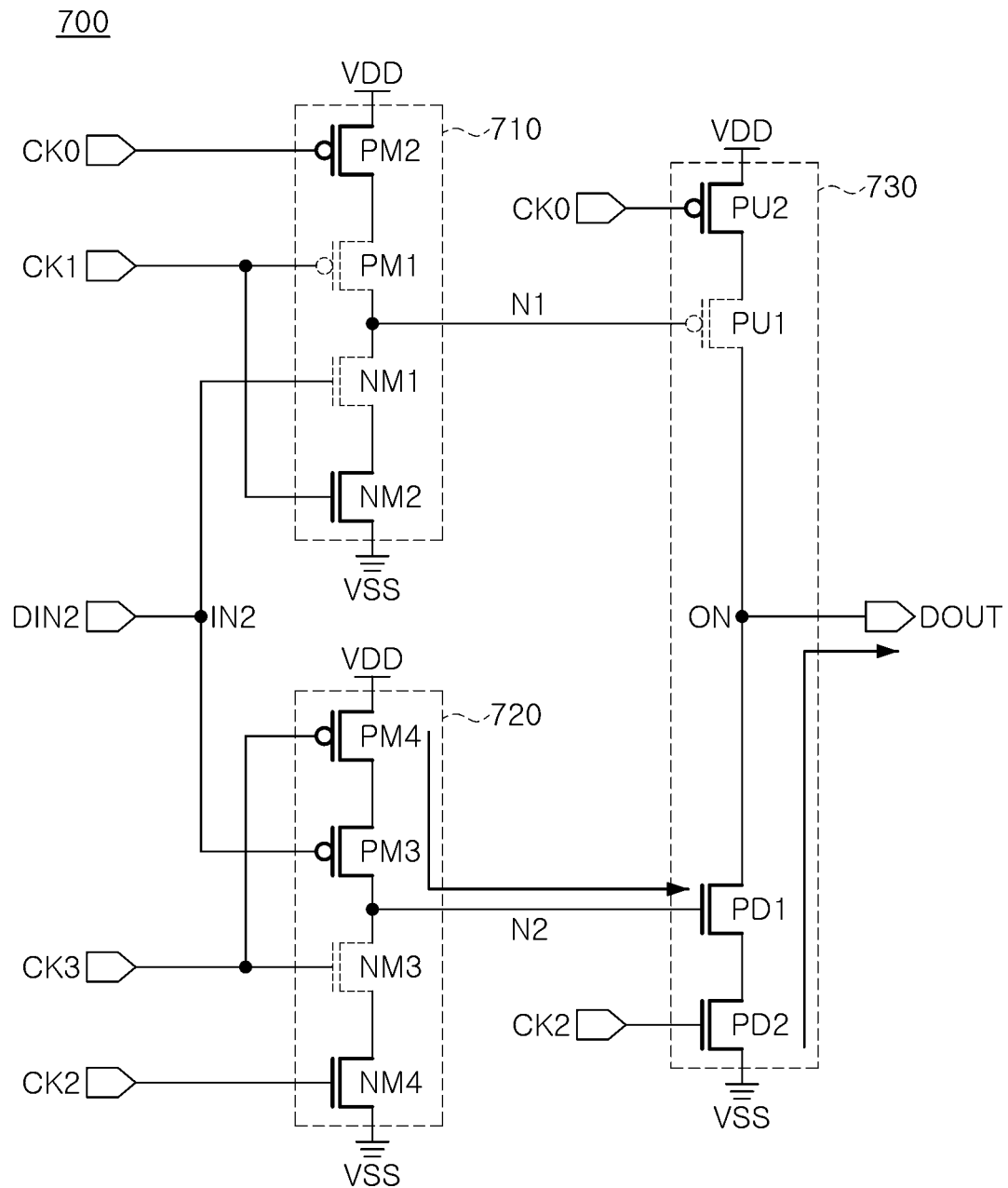

FIGS. 16 and 17 may be diagrams illustrating the operation of a third logic circuit 700 included in the serializer and connected between the third input node IN2 and the output node ON, and may be diagrams schematically illustrating an operation of the third logic circuit 700, for example, when the second data is transmitted as the data input signal DIN2. As described above, the second data may correspond to '0.'

Hereinafter, the operation of the third logic circuit 700 will be described with reference to FIG. 7. FIG. 16 illustrates the state of the third logic circuit 700 at the third point in time T3, and FIG. 17 illustrates the state of the third logic circuit 700 at a fourth point in time T4. Values of the first to fourth clock signals CK0-CK3 at the respective third point in time T3 and third point in time T4 may be as described in Table 3 below.

TABLE 3

| Point in time | CK0 | CK1 | CK2 | CK3 |
| --- | --- | --- | --- | --- |
| T3 | 1 | 1 | 0 | 0 |
| T4 | 0 | 1 | 1 | 0 |

Referring first to FIG. 16, at the third point in time T3, the first PMOS transistor PM1, the second PMOS transistor PM2, and the third NMOS transistor NM3 and the fourth NMOS transistor NM4 included in a first input circuit 710 and a second input circuit 720 may be turned off. Also, the second pull-up transistor PU2 and the second pull-down transistor PD2 included in the output circuit 530 may be turned off. On the other hand, the second NMOS transistor NM2 may be turned on by the second clock signal CK1, and the fourth PMOS transistor PM4 may be turned on by the fourth clock signal CK3.

Also, since the second data is transmitted as the third data input signal DIN2, the first NMOS transistor NM1 may be turned off and the third PMOS transistor PM3 may be turned on. Accordingly, as illustrated in FIG. 16, the second node N2 is connected to the first power node, and the voltage of the second node N2 is set to the first voltage level, such that the first full-down transistor PD1 may be turned on.

As illustrated in Table 3 above, at the fourth point in time T4, the values of the first clock signal CK0 and the third clock signal CK2 may change. As illustrated in FIG. 17, the second PMOS transistor PM2, the fourth NMOS transistor NM4, the second pull-up transistor PU2, and the second pull-down transistor PD2 may be turned on. The output node ON is connected to the second power node through the first pull-down transistor PD1 and the second pull-down transistor PD2, and the data output signal DOUT may be set to the second voltage level. Accordingly, data '0' such as the third data input signal DIN2 may be output as the data output signal DOUT.

Figure 18:
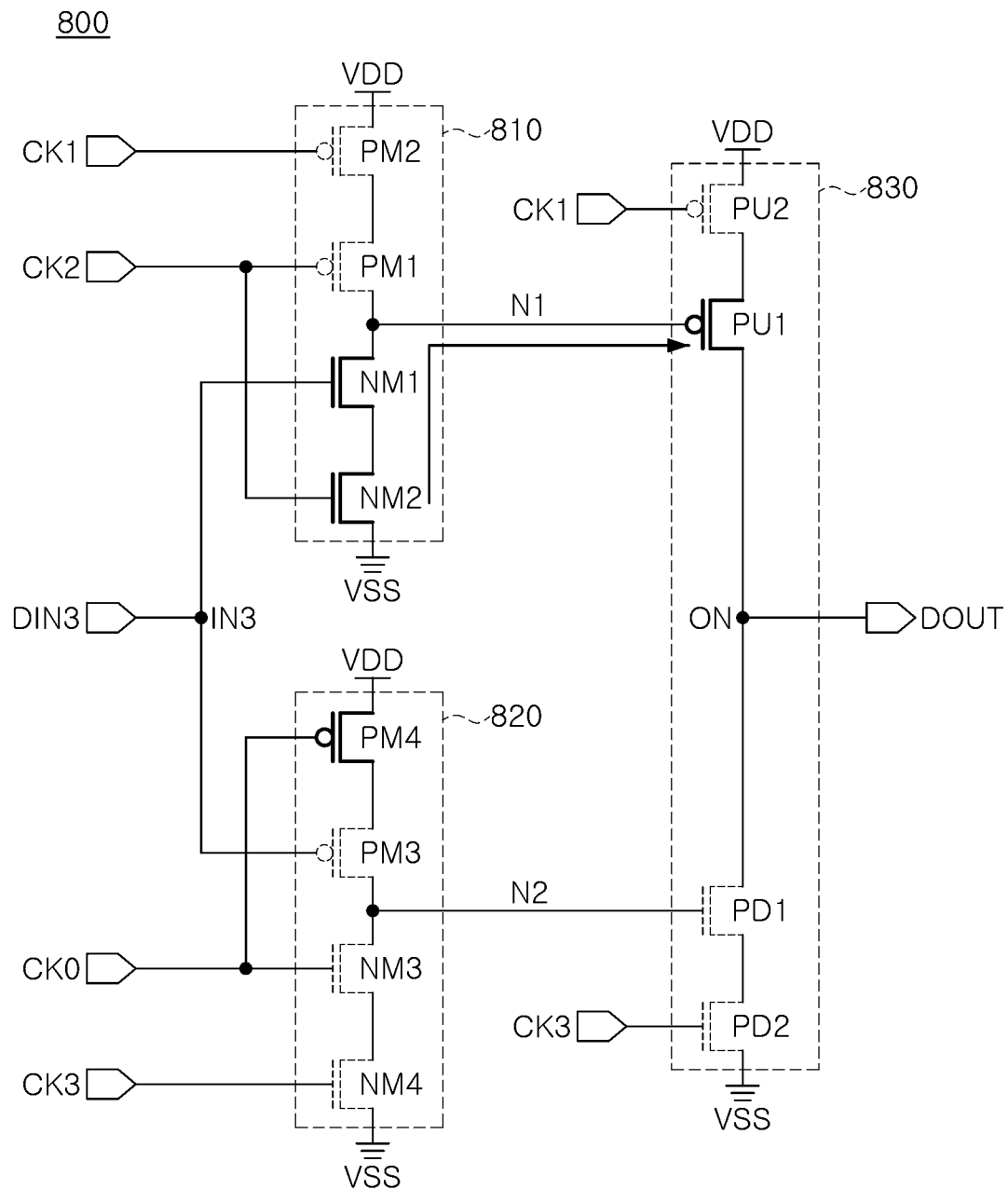
Figure 19:
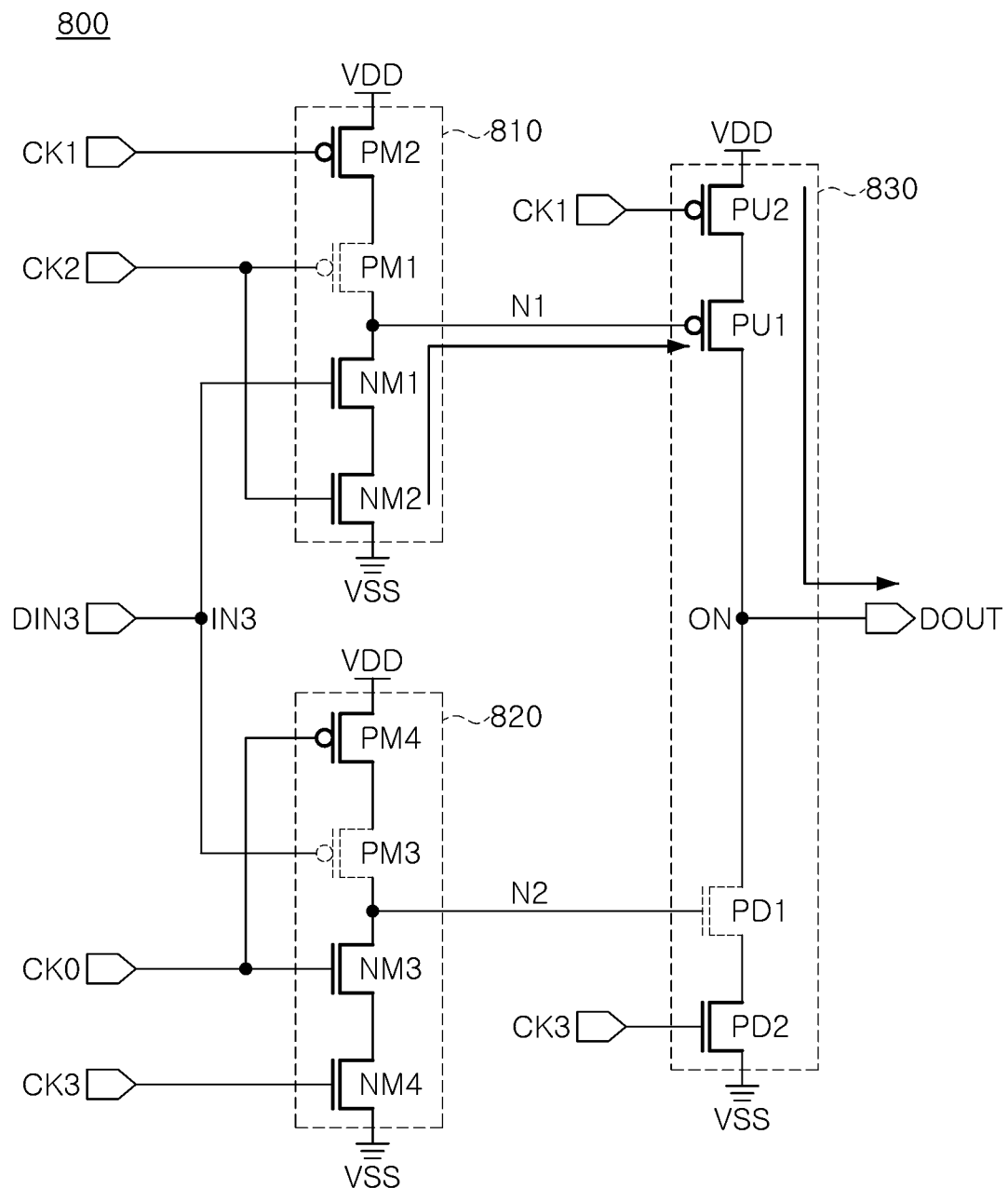

FIGS. 18 and 19 may be diagrams illustrating the operation of a fourth logic circuit 800 included in the serializer and connected between the fourth input node IN3 and the output node ON, and may be diagrams schematically illustrating an operation of the fourth logic circuit 800, for example, when the first data is transmitted as the fourth data input signal DIN3. As described above, the first data may correspond to '1.'

Like other embodiments described above, the operation of the fourth logic circuit 800 will be described with reference to FIG. 7. FIG. 18 illustrates a state of the fourth logic circuit 800 at the fourth point in time T4, and FIG. 19 illustrates a state of the fourth logic circuit 800 at a fifth point in time T5. Values of the first to fourth clock signals CK0-CK3 at the respective fourth point in time T4 and fifth point in time T5 may be as described in Table 4 below.

TABLE 4

| Point in time | CK0 | CK1 | CK2 | CK3 |
|---|---|---|---|---|
| T4 | 0 | 1 | 1 | 0 |
| T5 | 0 | 0 | 1 | 1 |

Referring first to FIG. 18, at the third point in time T3, the first PMOS transistor PM1, the second PMOS transistor PM2, and the third NMOS transistor NM3 and the fourth NMOS transistor NM4 included in a first input circuit 810 and a second input circuit 820 are turned off, and the second pull-up transistor PU2 and the second pull-down transistor PD2 included in the output circuit 530 are also turned off. On the other hand, the second NMOS transistor NM2 may be turned on by the third clock signal CK2, and the fourth PMOS transistor PM4 may be turned on by the first clock signal CK0.

Since the fourth data input signal DIN3 transmits the first data, the first NMOS transistor NM1 may be turned on and the third PMOS transistor PM3 may be turned off. Therefore, as illustrated in FIG. 18, the first node N1 is connected to the second power node, and the voltage of the first node N1 is set to the second voltage level, such that the first full-up transistor PU1 of a output circuit 830 may be turned on.

On the other hand, at the fifth point in time T5, the values of the second clock signal CK1 and the fourth clock signal CK3 may change. Accordingly, as illustrated in FIG. 19, the second PMOS transistor PM2, the fourth NMOS transistor NM4, the second pull-up transistor PU2, and the second pull-down transistor PD2 may be turned on. The output node ON is connected to the first power node through the first pull-up transistor PU1 and the second pull-up transistor PU2, and the data output signal DOUT may be set to the first voltage level. Accordingly, the data '1' such as the fourth data input signal DIN3 may be output as the data output signal DOUT.

As described with reference to FIGS. 8 to 19, each of the logic circuits 500, 600, 700, and 800 included in the serializer according to an example embodiment may set the voltage of the first node N1 or the second node N2 to the first voltage level or the second voltage level according to data transmitted to the respective first to fourth data input signals DIN0-DIN3. For example, when the first data is transmitted as the data input signal, the voltage of the second node N2 is set to the first voltage level, and when the second data is transmitted as the data input signal, the voltage of the first node N1 may be set to the second voltage level.

After the voltage of the first node N1 is set to the second voltage level or the voltage of the second node N2 is set to the first voltage level, the data output signal DOUT may be set as the first data or the second data in response to the rising edge of one of the first to fourth clock signals CK0-CK3. In detail, each of the logic circuits 500, 600, 700, and 800 included in the serializer according to an example embodiment may store the complementary data transmitted as the data input signal in one of the first node N1 and the second node N2, and then, may output the data transmitted as the data input signal to the output node ON in response to the rising edge of the clock signal. Thus, advantageously, a serializer may be implemented without using a transmission gate. In addition, since data is output to the output node ON at the rising edge of the clock signal using the complementary data stored in advance in the first node N1 or the second node N2, a serializer advantageous for high-speed operation may be implemented.

Figure 20:
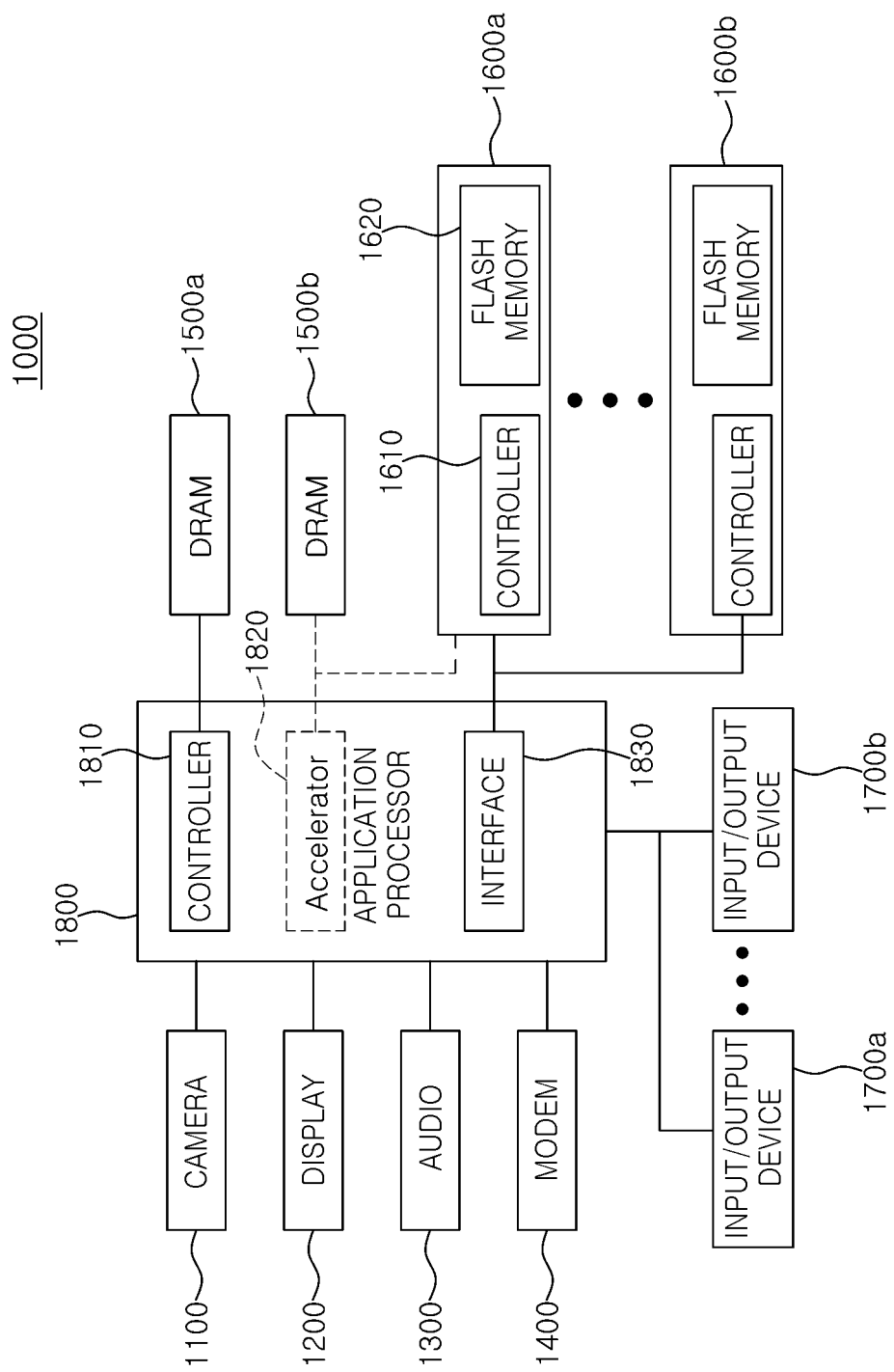
FIG. 20 is a schematic diagram illustrating a system including a memory device according to an example embodiment.

FIG. 20 is a schematic diagram illustrating a system including a memory device according to an example embodiment. Referring to FIG. 20, a system 1000 may include a camera 1100, a display 1200, an audio processing unit 1300, a modem 1400, DRAMs 1500a and 1500b, flash memory devices 1600a and 1600b, input/output devices 1700a and 1700b, a sensor device 1800, and an application processor (hereinafter, "AP") 1900.

The system 1000 may be implemented as a laptop computer, a portable terminal, a smartphone, a tablet PC, a wearable device, a healthcare device, or an Internet-of-Things (IoT) device. In addition, the system 1000 may be implemented as a server or a personal computer.

Various components included in the system 1000 may operate in synchronization with a predetermined clock. For example, the display 1200 may display a screen according to a predetermined scan rate, and the DRAMs 1500a and 1500b and the flash memory devices 1600a and 1600b may also store and read data at a predetermined speed or may operate according to a predetermined clock to communicate with other external devices. The input/output devices 1700a and 1700b and the application processor 1900 may also operate according to a predetermined clock.

The camera 1100 may capture a still image or a moving image according to a user's control. The system 1000 may acquire specific information using a still image/video captured by the camera 1100, or convert the still image/video into other types of data such as text or the like and may store the converted data. The camera 1100 may include a plurality of cameras having different angles of view or aperture values. In addition, the camera 1100 may further include a camera that generates a depth image by using depth information of the subject and/or background, in addition to a camera that generates an actual image by imaging the subject.

The display 1200 may be used as an input device of the system 1000 by providing a touch screen function. Also, the display 1200 may be provided integrally with a fingerprint sensor and the like to provide a security function of the system 1000. The audio processing unit 1300 may process audio data stored in the flash memory devices 1600a and 1600b or audio data included in content received externally through the modem 1400, the input/output devices 1700a and 1700b, or the like.

The modem 1400 modulates and transmits a signal to transmit/receive wired/wireless data, while demodulating a signal received from the outside to restore an original signal.

The input/output devices 1700a and 1700b are devices that provide digital input/output, and may include a port that may be connected to an external recording medium, an input device such as a touch screen or a mechanical button key, an output device capable of outputting vibrations in a haptic manner or other manners, and the like.

The sensor device 1800 may include a plurality of sensors that collect various pieces of information from the outside. In an example embodiment, the sensor device 1800 may include an illuminance sensor that detects the brightness of light, a gyro-sensor detecting the movement of the system 1000, a biosensor for obtaining biometric information from a user's body in contact with and/or in proximity to the system 1000, and the like.

The AP 1900 may control the overall operation of the system 1000. In detail, the AP 1900 may control the display 1200 such that a portion of the contents stored in the flash memory devices 1600a and 1600b is displayed on the screen. Also, when a user input is received through the input/output devices 1700a and 1700b, the AP 1900 may perform a control operation corresponding to the user input.

In an example embodiment, the AP 1900 may include an accelerator block 1920 that is a dedicated circuit for AI data operation. Alternatively, according to example embodiments, a separate accelerator chip may be provided separately from the AP 1900, and the DRAM 1500b may be additionally connected to the accelerator block 1920 or the accelerator chip. The accelerator block 1920 is a function block that professionally performs a specific function of the AP 1900, and may include a graphics processing unit (GPU) as a functional block, which specializes in processing graphics data, a Neural Processing Unit (NPU) that is a block for professionally performing AI calculations and inference, a Data Processing Unit (DPU) as a block that specializes in data processing, and the like.

The serializer according to an example embodiment may be variously employed in components connected to each other in the system 1000 to communicate with each other. For example, the serializer according to an example embodiment may be connected to a driver inputting and outputting signals in at least one of the camera 1100, the display 1200, the audio processing unit 1300, the modem 1400, the DRAMs 1500a and 1500b, the flash memory devices 1600a and 1600b, the input/output devices 1700a and 1700b, the sensor device 1800 and the AP 1900.

As set forth above, according to an example embodiment, the serializer receives data input signals from a plurality of latches and is synchronized with a plurality of clock signals input to the plurality of latches to serialize the data input signals and generate a data output signal. Accordingly, since a process of generating a separate clock signal to generate a data output signal is omitted, a serializer that is advantageous for high-speed operation may be implemented. In addition, in a state in which the respective data input signals are stored in advance in the serializer, the data input signals are reflected to the output node by the on/off operation of the transistors by the clock signals, and accordingly, a separate transmission gate may be omitted, thereby improving jitter characteristics of the data output signal and improving the response speed of the serializer.

While example embodiments have been illustrated and described above, it will be apparent to those skilled in the art that modifications and variations could be made without departing from the scope of the present inventive concept as defined by the appended claims.

What is claimed is:

1. A semiconductor device, comprising:
a first logic circuit connected between a first input node receiving a first data input signal and an output node, and configured to output the first data input signal to the output node at a rising edge of a first clock signal having a phase difference of 90 degrees from the first data input signal, said first logic circuit comprising an input circuit having one input terminal responsive to the first data input signal and another input terminal responsive to the first clock signal;
a second logic circuit connected between a second input node receiving a second data input signal and the output node, and configured to output the second data input signal to the output node at a rising edge of a second clock signal having a phase difference of 90 degrees from the second data input signal, said second logic circuit comprising an input circuit having one input terminal responsive to the second data input signal and another input terminal responsive to the second clock signal;
a third logic circuit connected between a third input node receiving a third data input signal and the output node, and configured to output the third data input signal to the output node at a rising edge of a third clock signal that is 180 degrees out of phase relative to the first clock signal, said third logic circuit comprising an input circuit having one input terminal responsive to the third data input signal and another input terminal responsive to the third clock signal; and
a fourth logic circuit connected between a fourth input node receiving a fourth data input signal and the output node, and configured to output the fourth data input signal to the output node at a rising edge of a fourth clock signal that is 180 degrees out of phase relative to the second clock signal, said fourth logic circuit comprising an input circuit having one input terminal responsive to the fourth data input signal and another input terminal responsive to the fourth clock signal; and
wherein the first though fourth clock signals are out of phase relative to each other.

2. The device of claim 1, wherein the third clock signal has a phase difference of 90 degrees from the third data input signal, and the fourth clock signal has a phase difference of 90 degrees from the fourth data input signal.

3. The device of claim 1, wherein a duty ratio of each of the first to fourth clock signals is 50%.

4. The device of claim 3, wherein a frequency of a data output signal output from the output node is four times a frequency of each of the first to fourth clock signals.

5. The device of claim 1, wherein a time between a point in time at which the first data input signal is input to the first input node and a point in time at which the second data input signal is input to the second input node is equal to a time corresponding to the phase difference of 90 degrees.

6. The device of claim 1, wherein the input circuit within the first logic circuit comprises an in-series arrangement of a PMOS pull-up transistor having a gate terminal responsive to the first data input signal, and an NMOS pull-down transistor having a gate terminal responsive to the first clock signal.

7. The device of claim 6, wherein the input circuit within the second logic circuit comprises an in-series arrangement of a PMOS pull-up transistor having a gate terminal responsive to the second data input signal, and an NMOS pull-down transistor having a gate terminal responsive to the second clock signal.

8. The device of claim 1, wherein the input circuit within the first logic circuit comprises a first in-series arrangement of:
- a first PMOS pull-up transistor having a gate terminal responsive to the first data input signal;
- a second PMOS pull-up transistor having a gate terminal responsive to the second clock signal;
- a first NMOS pull-down transistor having a gate terminal responsive to the first clock signal; and
- a second NMOS pull-down transistor having a gate terminal responsive to the second clock signal.

9. The device of claim 8, wherein the input circuit within the first logic circuit comprises a second in-series arrangement of:
- a first PMOS pull-up transistor having a gate terminal responsive to the fourth clock signal;
- a second PMOS pull-up transistor having a gate terminal responsive to the third clock signal;
- a first NMOS pull-down transistor having a gate terminal responsive to the fourth clock signal; and
- a second NMOS pull-down transistor having a gate terminal responsive to the first data input signal.

10. The device of claim 1, wherein the first data input signal received at the first input node, the second data input signal received at the second input node, the third data input signal received at the third input node, and the fourth data input signal received at the first input node are latched by first, second, third and fourth latch circuits, respectively.

11. A semiconductor device, comprising:
- a first logic circuit connected between a first input node receiving a first data input signal and an output node, and configured to output the first data input signal to the output node at a rising edge of a first clock signal having a phase difference of 90 degrees from the first data input signal;
- a second logic circuit connected between a second input node receiving a second data input signal and the output node, and configured to output the second data input signal to the output node at a rising edge of a second clock signal having a phase difference of 90 degrees from the second data input signal;
- a third logic circuit connected between a third input node receiving a third data input signal and the output node, and configured to output the third data input signal to the output node at a rising edge of a third clock signal that is 180 degrees out of phase relative to the first clock signal;
- a fourth logic circuit connected between a fourth input node receiving a fourth data input signal and the output node, and configured to output the fourth data input signal to the output node at a rising edge of a fourth clock signal that is 180 degrees out of phase relative to the second clock signal;
- a first latch circuit, which is configured to transmit the first data input signal to the first input node, and operate in synchronization with the fourth clock signal;
- a second latch circuit, which is configured to transmit the second data input signal to the second input node, and operate in synchronization with the first clock signal;
- a third latch circuit configured to transmit the third data input signal for the third input node; and
- a fourth latch circuit configured to transmit the fourth data input signal for the fourth input node.

12. The device of claim 11,
wherein each of the third latch circuit and the fourth latch circuit includes a first sub-latch and a second sub-latch connected to each other in series;
wherein in the third latch circuit, the first sub-latch operates in synchronization with the fourth clock signal and the second sub-latch operates in synchronization with the second clock signal; and
wherein in the fourth latch circuit, the first sub-latch operates in synchronization with the first clock signal and the second sub-latch operates in synchronization with the third clock signal.

* * * * *

UNITED STATES PATENT AND TRADEMARK OFFICE
CERTIFICATE OF CORRECTION

| | | |
|---|---|---|
| PATENT NO. | : 12,431,901 B2 | Page 1 of 1 |
| APPLICATION NO. | : 18/175795 | |
| DATED | : September 30, 2025 | |
| INVENTOR(S) | : Hyunyoon Cho et al. | |

It is certified that error appears in the above-identified patent and that said Letters Patent is hereby corrected as shown below:

In the Claims

At Column 20, Line 25 (Claim 11):
"input signal for the fourth input node."
Should read:
--input signal to the fourth input node.--

Signed and Sealed this
Thirtieth Day of December, 2025

John A. Squires
*Director of the United States Patent and Trademark Office*